(12) United States Patent
Yamashita et al.

(10) Patent No.: US 7,999,352 B2
(45) Date of Patent: Aug. 16, 2011

(54) SEMICONDUCTOR DEVICE

(75) Inventors: Kimihiko Yamashita, Hyogo (JP);
Yasunori Hashimoto, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 1184 days.

(21) Appl. No.: 11/060,753

(22) Filed: Feb. 18, 2005

(65) Prior Publication Data
US 2006/0027892 A1    Feb. 9, 2006

(30) Foreign Application Priority Data
Feb. 19, 2004   (JP) .................. 2004-042683

(51) Int. Cl.
*H01L 27/08* (2006.01)
(52) U.S. Cl. .......... 257/536; 257/E27.047; 257/E29.141
(58) Field of Classification Search .................. None
See application file for complete search history.

(56) References Cited

U.S. PATENT DOCUMENTS

| | | | | |
|---|---|---|---|---|
| 5,269,880 | A * | 12/1993 | Jolly et al. | 438/701 |
| 5,486,492 | A * | 1/1996 | Yamamoto et al. | 438/629 |
| 5,552,343 | A * | 9/1996 | Hsu | 438/586 |
| 6,124,208 | A * | 9/2000 | Park et al. | 438/696 |
| 6,667,537 | B1 * | 12/2003 | Koike et al. | 257/536 |
| 7,276,767 | B2 * | 10/2007 | Huttemann et al. | 257/359 |
| 7,312,515 | B2 * | 12/2007 | Yamashita et al. | 257/537 |
| 2001/0055883 | A1 * | 12/2001 | Kawazoe | 438/700 |
| 2004/0096591 | A1 * | 5/2004 | Kimino | 427/421 |

FOREIGN PATENT DOCUMENTS

| | | |
|---|---|---|
| JP | 58-148443 | 9/1983 |
| JP | 60-024050 | 2/1985 |
| JP | 61-100956 | 5/1986 |
| JP | 03-034352 | 2/1991 |
| JP | 07-335831 | 12/1995 |
| JP | 2699559 | 9/1997 |
| JP | 10-056007 | 2/1998 |
| JP | 2932940 | 5/1999 |
| JP | 2000-012684 | 1/2000 |
| JP | 3185677 | 5/2001 |
| JP | 2002-124639 | 4/2002 |
| JP | 2002-203943 | 7/2002 |
| JP | 2002-261237 | 9/2002 |

OTHER PUBLICATIONS

Notice of Rejection of Japanese Patent Application No. 2004-319641 (priority application of 2004-042683), dated Mar. 16, 2010.

* cited by examiner

*Primary Examiner* — Benjamin P Sandvik
(74) *Attorney, Agent, or Firm* — Dickstein Shapiro LLP

(57) ABSTRACT

A semiconductor device equipped with a metal thin film resistor is disclosed. The semiconductor device includes a second interlayer insulating film formed on a first interlayer insulating film including a formation area of a wiring pattern. Connecting holes are formed in the second interlayer insulating film corresponding to both ends of the metal thin film resistor and the wiring pattern. An upper part of each connecting hole is formed in a taper shape. A sidewall is formed on the inner wall of each connecting hole. The metal thin film resistor is formed on the second interlayer insulating film between the connecting holes, inside of each connecting hole, and on the wiring pattern.

11 Claims, 19 Drawing Sheets

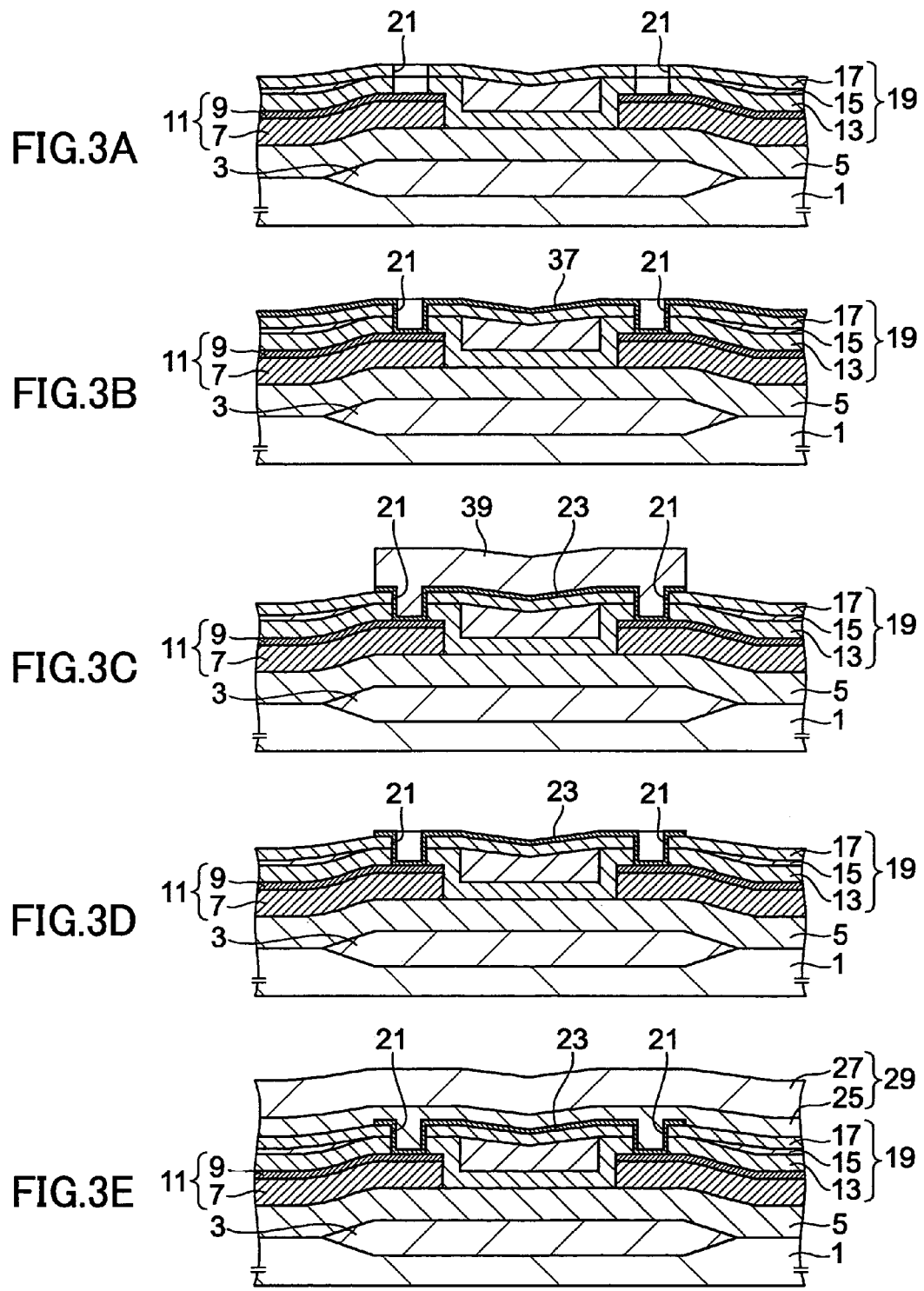

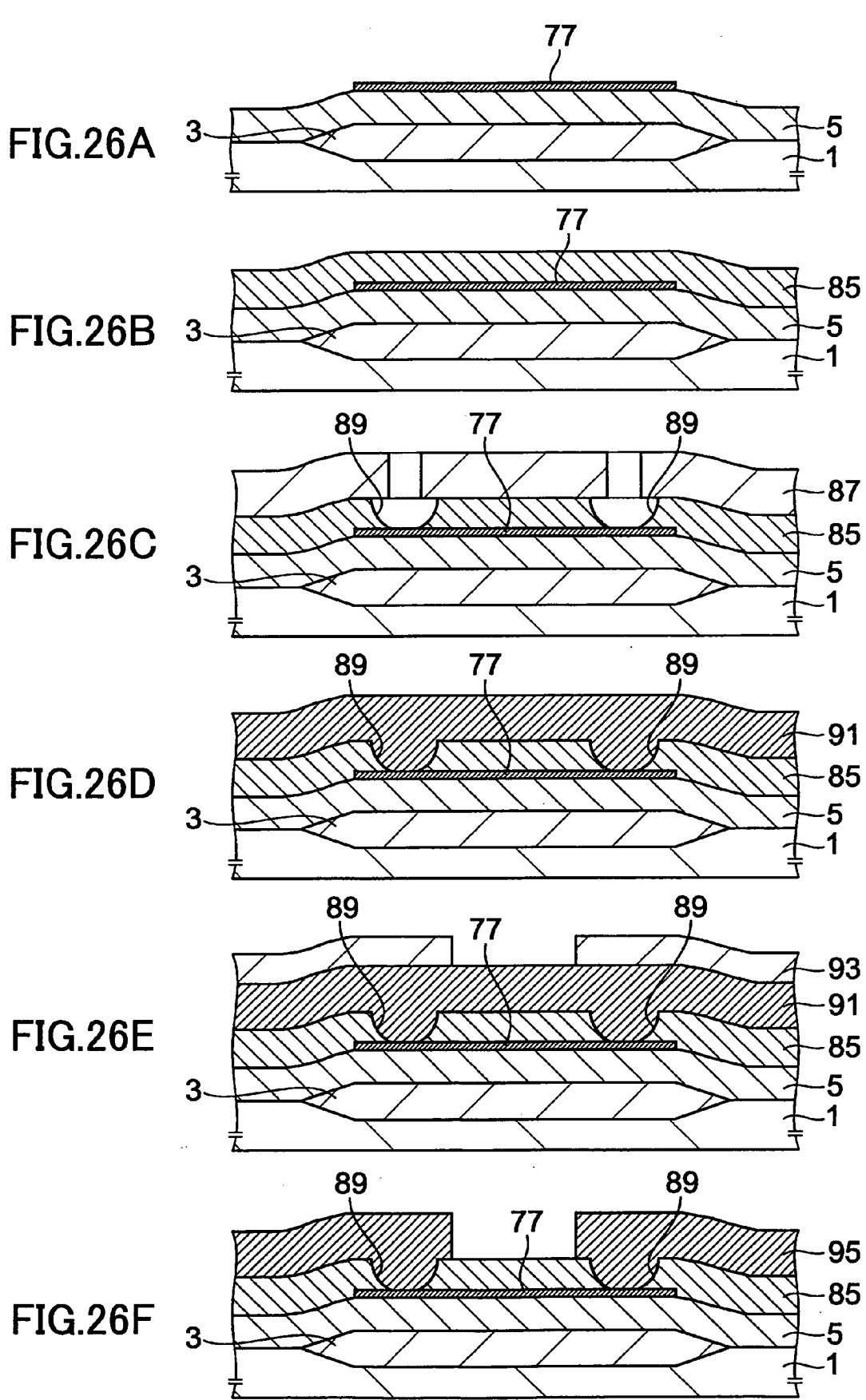

SEMICONDUCTOR DEVICE

BACKGROUND OF THE INVENTION

1. Field of the Invention

The present invention generally relates to a semiconductor device, and especially relates to a semiconductor device including a metal thin-film resistor that consists of a metal thin film formed on an insulating film.

2. Description of the Related Art

In an analog integrated circuit, a great number of resistors are used as important elements. In recent years, a resistor (a metal thin film resistor) that consists of a metal thin film has attracted attention for its low temperature dependency of the resistance (called TCR). As a material of the metal thin film resistor, chromium silicon (CrSi), nickel chromium (NiCr), tantalum nitride (TaN), chromium silicide ($CrSi_2$), chromium silicide nitride (CrSiN), chromium silicon oxy (CrSiO), and the like are used.

In a semiconductor device equipped with a metal thin film resistor, in order to attain a high degree of integration, the metal thin film resistor, the thickness of which is less than 1000 Å (Angstroms), is often used while aiming at a higher sheet resistance.

Conventional methods of making an electrical connection to the metal thin film resistor are as follows:

1) connecting a metal wire directly to the metal thin film resistor (for example, Patent Reference 1);

2) connecting a metal wire through a connection hole that is formed to an interlayer insulating film that is formed after forming a metal thin film resistor (for example, Patent Reference 2 and Patent Reference 3); and 3) connecting a metal wire to a barrier film that is formed on a metal thin film resistor layer (for example, Patent Reference 4 and Patent Reference 5).

The conventional methods 1), 2), and 3) above are specifically described.

The conventional method 1) is described with reference to FIGS. 25A-25F.

(1) A BPSG (borophospho silicate glass) film, which serves as a first interlayer insulating film 5 of a gate electrode of a transistor and a metal wiring, is formed on a wafer-shaped silicon substrate 1, on which a device separating oxide film 3, a transistor element, etc. (illustration is omitted) are formed, and a reflow process, e.g., is carried out (refer to FIG. 25A).

(2) A metal thin film 73 for forming a metal thin film resistor is formed all over the top of the silicon substrate 1 in about 20-500 Å thickness (refer to FIG. 25B).

(3) A resist pattern 75 for demarcating a region for forming the metal thin film resistor is formed on the metal thin film 73, the metal thin film 73 is patterned using the resist pattern 75 as a mask, and a metal thin film resistor 77 is formed (refer to FIG. 25C).

(4) The resist pattern 75 is removed, and a metal film 79 for wiring that consists of an AlSiCu film is formed all over the top of the first interlayer insulating film 5 including the top of the metal thin film resistor 77. A resist pattern 81 is formed on the metal film 79 for wiring such that the metal film 79 for wiring remains on both ends of the metal thin film resistor 77 by patterning using the resist pattern 81 (refer to FIG. 25D).

(5) A metal wiring pattern 83 is formed by patterning the metal film 79 for wiring using wet etching technology, the resist pattern 81 serving as a mask (refer to FIG. 25E). Generally, in manufacturing processes of common semiconductor devices, dry etching technology is used for forming the metal film 79 for wiring; however, since the metal thin film resistor 77 is etched by excessive etching, dry etching technology cannot be used in this case wherein the metal thin film resistor 77 with a small thickness is present directly under the metal film 79 for wiring. Therefore, it is necessary to carry out patterning of the metal film 79 for wiring by the wet etching technology.

(6) By removing the resist pattern 81, formation of the metal thin film resistor 77, and the metal wiring pattern 83 electrically connecting to the metal thin film resistor 77 is completed (refer to FIG. 25F).

Next, the conventional method 2) is described with reference to FIGS. 26A-26F.

(1) The device separating oxide film 3, the first interlayer insulating film 5, and the metal thin film resistor 77 are formed on the silicon substrate 1 in the same processes (1) through (3) as described above with reference to FIGS. 25A-25F (refer to FIG. 26A).

(2) Then, a CVD (chemical vapor deposition) oxide film 85, which serves as an interlayer insulating film of metal wiring, is formed on the first interlayer insulating film 5 including the top of the metal thin film resistor 77 at about a film thickness of 2000 Å (refer to FIG. 26B).

(3) A resist pattern 87 is formed on the CVD oxide film 85, which resist pattern is for forming connection holes 89 corresponding to both ends of the metal thin film resistor 77 for metal wiring connection. The connection holes 89 are formed by selectively removing the CVD oxide film 85 by wet etching technology using the resist pattern 87 as a mask (refer to FIG. 26C). Generally, in manufacturing processes of common semiconductor devices, dry etching technology is used when forming the connecting holes 89; however, in this case where the metal thin film resistor 77 is thinner than 1000 Å, it is difficult to prevent the connecting holes 89 from running through the metal thin film resistor 77. Accordingly, it is necessary to form the connecting holes 89 by the wet etching technology.

(4) A metal film 91 for wiring, consisting of an AlSiCu film, is formed on the CVD oxide film 85 including the inside of the connecting holes 89 (refer to FIG. 26D).

(5) A resist pattern 93 is formed on the metal film 91 for wiring for carrying out patterning so that the metal film 91 remains on both ends of the metal thin film resistor 77 for wiring (refer to FIG. 26E).

(6) A metal wiring pattern 95 is formed by patterning of the metal film 91 for wiring by dry etching technology using the resist pattern 93 serving as a mask. Since the CVD oxide film 85 is formed at the bottom of the metal film 91 for wiring at this time, even if the dry etching technology is used, the metal thin film resistor 77 is not etched.

By removing the resist pattern 93, formation of the metal thin film resistor 77, and the metal wiring pattern 95 for electrically connecting the metal thin film resistor 77 is completed (refer to FIG. 26F).

The conventional method 3) is described with reference to FIGS. 27A-27E.

(1) The device separating oxide film 3, the first interlayer insulating film 5, and the metal thin film resistor 77 are formed on the silicon substrate 1 by the same processes (1) through (3) described with reference to FIGS. 25A-25C (refer to FIG. 27A).

(2) A high melting point metal film 97, made of such as TiW, serving as a barrier film to metal wiring is formed on the first interlayer insulating film 5 including the top of the metal thin film resistor 77. Further, a metal film 99 for wiring, made of such as an AlSi film and an AlSiCu film is formed on the high melting point metal film 97 (refer to FIG. 27B).

(3) A resist pattern 101 for patterning the metal film 99 for wiring to remain on both ends of the metal thin film resistor 77 is formed on the metal film 99 for wiring (refer to FIG. 27C).

(4) A metal wiring pattern 103 is formed by patterning the metal film 99 for wiring by dry etching technology using the resist pattern 101 as a mask (refer to FIG. 27D). Since the high melting point metal film 97 is formed at the bottom of the metal film 99 for wiring at this time, even if dry etching technology is used, the metal thin film resistor 77 is not etched.

(5) The resist pattern 101 is removed. Then, a high melting point metal film pattern 105 is formed by selectively removing the high melting point metal film 97 by wet etching technology using the metal wiring pattern 103 as a mask. In this manner, the metal thin film resistor 77, the metal wiring pattern 103 for electrical connection of the metal thin film resistor 77, and the high melting point metal film pattern 105 are formed (refer to FIG. 27E). Here, since the high melting point metal film 97 is located immediately above the metal thin film resistor 77, patterning of the high melting point metal film 97 by dry etching technology is difficult.

Further, a semiconductor integrated circuit device equipped with a resistor that is formed on a top layer wiring electrode through an insulating film, and is connected with the top layer wiring electrode has been disclosed (for example, Patent Reference 6), although the resistor is not a metal thin film resistor. A manufacturing method of a semiconductor device applying such structure to a metal thin film resistor is described with reference to FIGS. 28A-28D.

(1) On the wafer-shaped silicon substrate 1, on which the device separating oxide film 3, a transistor element, etc. (illustration is omitted) are formed, the BPSG film serving as the first interlayer insulating film 5 of the gate electrode of the transistor and metal wiring is formed. After a reflow process, and the like, a metal wiring pattern 107 and a second interlayer insulating film 109 are formed on the first interlayer insulating film 5 (refer to FIG. 28A). The second interlayer insulating film includes a CVD oxide film, an SOG (spin on glass) film, and a CVD oxide film, that are layered in this sequence from bottom to top. FIGS. 28A-28D show the CVD oxide film, the SOG film, and the CVD oxide film constituting the second interlayer insulating film 109 in one body.

(2) A resist pattern 111 for demarcating a region to form a connecting hole 113 to the second interlayer insulating film 109 is formed (refer to FIG. 28B).

(3) The connecting hole 113 is formed to the second interlayer insulating film 109 on the wiring pattern 107 by selectively removing the second interlayer insulating film 109 by dry etching technology using the resist pattern 111 as a mask. At this time, the upper surface of the wiring pattern 107 is also removed by over-etching (refer to FIG. 28C).

(4) The resist pattern 111 is removed. Then, a metal thin film 115 for forming a metal thin film resistor all over the second interlayer insulating film 109 including the formation region of the connecting hole 113 is formed in a film thickness of about 20-500 Å (refer to FIG. 28D)

Then, the metal thin film 115 is patterned to a predetermined form, and the metal thin film resistor is formed.

[Patent reference 1] JPA, 2002-124639
[Patent reference 2] JPA, 2002-261237
[Patent reference 3] Japanese Patent No. 2699559
[Patent reference 4] Japanese Patent No. 2932940
[Patent reference 5] Japanese Patent No. 3185677
[Patent reference 6] JPA, 58-148443

DESCRIPTION OF THE INVENTION

Problem(s) To Be Solved By The Invention

As descried above, according to the method 1), the metal film 79 for wiring cannot be patterned by dry etching technology at the process (5) described with reference to FIG. 25E when forming the metal wiring pattern 83 directly on the metal thin film resistor 77. For this reason, formation of a detailed pattern is difficult, and high integration of a circuit cannot be attained.

Further, generally, the metal thin film resistor 77 is easy to be oxidized; and where the surface of the metal thin film resistor 77 is oxidized, even if the metal film 79 for wiring is formed, a satisfactory electrical connection between the metal thin film resistor 77 and the metal wiring pattern 83 cannot be obtained. The electrical connection to the metal wiring may be satisfactorily obtained by removing the natural oxide film using hydrofluoric acid as practiced in a manufacturing process of general semiconductor devices. However, since the hydrofluoric acid etches the metal thin film resistor 77, if the process to remove the oxide film using hydrofluoric acid is performed before forming the metal film 79 for wiring at the process (4) described with reference to FIG. 25D, the resistance of the metal thin film resistor 77 is subjected to variation.

According to the method 2), dry etching technology can be used in patterning the metal film 91 for wiring at the process (6) described with reference to FIG. 26F by forming the interlayer insulating film 85 (the CVD oxide film 85) on the metal thin film resistor 77.

However, wet etching technology has to be used to open the connecting holes 89 to electrically connect the metal wiring pattern 95 and the metal thin film resistor 77 as described at the process (3) with reference to FIG. 26C, which poses another problem in that the degree of circuit integration cannot be raised. Further, when the wet etching process is carried out in order to form the connecting hole 89, hydrofluoric acid is used. In order to prevent the metal thin film resistor 77 from being etched by the hydrofluoric acid, additional processes of providing a barrier on the metal thin film resistor 77 and patterning are required, which increase the number of processes, posing another problem.

According to the conventional method 3), as described at the process (4) with reference to FIG. 27D, an etching process of the metal film for wiring can be carried out by the dry etching technology, and formation of a connecting hole is not required. However, as described at the process (5) with reference to FIG. 27E, the wet etching technology is required to perform patterning of the high melting point metal film 97 for forming the high melting point metal film pattern 105 that substantially determines the length of the metal thin film resistor 77. In addition to the difficulty to obtain a high degree of circuit integration, another problem is that the high melting point metal film 97 tends to be etched more than desired, causing a variance in the length of the metal thin film resistor 77, which results in a variance in the resistance value.

Further, at the process (2) as described with reference to FIG. 27B, the high melting point metal film 97 is formed after the metal thin film resistor 77 is formed, and the surface of the metal thin film resistor 77 is oxidized, the oxidized surface degrading the electrical connection to the high melting point metal film 97. Accordingly, the oxide film has to be removed from the surface of the metal thin film resistor 77 before forming the high melting point metal film 97, and hydrofluoric acid is used. The oxide film removal process using the hydrofluoric acid is performed, which poses a problem that the resistance of the metal thin film resistor 77 varies.

As described above, according to the conventional methods, due to the metal thin film resistor being thin, at least one wet etching process is required, which is an obstacle to further miniaturization, and is a cause for variation of resistance values.

Further, due to the metal thin film resistor tending to be oxidized, it is difficult to obtain a satisfactory electrical connection to metal wiring. In order to cope with this, the process of forming the barrier film only for the metal thin film resistor, and the process of removing the surface oxide film by hydrofluoric acid are required. That is, the number of processes is increased, and the resistance values tend to vary.

Further, as shown in FIG. 28D, when the structure indicated by the Patent Reference 6 (wherein a resistor is formed on the top layer wiring electrode through the insulating film, and connected to the top layer wiring electrode) is applied to a metal thin film resistor, the contact resistance between the metal thin film resistor and the wiring pattern 107 becomes great and tends to vary. This is due to that "step coverage" (i.e., (level difference covering property) of the metal thin film 115 becomes poor on the inner wall of the connecting hole 113, especially at the bottom of the connecting hole 113.

SUMMARY OF THE INVENTION

It is a general object of the present invention to provide a semiconductor device that substantially obviates one or more of the problems caused by the limitations and disadvantages of the related art.

Specifically, the present invention aims at offering a semiconductor device that includes a metal thin film resistor, wherein the resistance of the metal thin film resistor and the contact resistance between a wiring pattern and the metal thin film resistor are stabilized.

Features and advantages of the present invention are set forth in the description that follows, and in part will become apparent from the description and the accompanying drawings, or may be learned by practice of the invention according to the teachings provided in the description. Objects as well as other features and advantages of the present invention will be realized and attained by a semiconductor device particularly pointed out in the specification in such full, clear, concise, and exact terms as to enable a person having ordinary skill in the art to practice the invention.

To achieve these and other advantages and in accordance with the purpose of the invention, as embodied and broadly described herein, the invention provides the semiconductor device as follows.

Means For Solving The Problem

The semiconductor device according to the present invention includes a connecting hole that is formed in an insulating film on a wiring pattern, a sidewall formed on the inner wall of the connecting hole, and a metal thin film resistor that is formed on the insulating film and in the connecting hole, the metal thin film resistor being electrically connected to the wiring pattern.

The metal thin film resistor of the semiconductor device according to the present invention is electrically connected to the wiring pattern through the connecting hole formed in the insulating film corresponding to the wiring pattern formed below the metal thin film resistor. For this reason, a patterning process using the wet etching technology is not required after forming the metal thin film resistor. Further, since the contact surface between the wiring pattern and the metal thin film resistor is not exposed to the atmosphere, a process of removing the surface oxide film is not required; and for the same reason, a barrier film formation for preventing the metal thin film resistor from being etched is not required to obtain the stable and satisfactory electrical connection between the metal thin film resistor and the wiring pattern. In this manner, miniaturization of the metal thin film resistor and stabilization of the resistance are realized regardless of the thickness of the metal thin film resistor, without increasing the number of process steps.

Further, according to the semiconductor device of the present invention, the sidewall is formed on the inner wall of the connecting hole for electrically connecting the metal thin film resistor and the wiring pattern. In this way, the step coverage of the metal thin film resistor inside the connecting hole is raised, and the contact resistance between the wiring pattern and the metal thin film resistor is stabilized.

An aspect of the present invention provides the semiconductor device wherein at least the upper part of the connecting hole is formed in the shape of a taper. One of the conventional problems is that the step coverage of the metal thin film becomes poor when the metal thin film for the metal thin film resistor is formed inside the connecting hole due to the metal thin film deposited at the upper part of the connecting hole. By forming the upper part of the connecting hole in the taper shape, an overhang of the metal thin film deposited near the upper part of the connecting hole is prevented from occurring when forming the metal thin film. Accordingly, undesired influence to the deposition of the metal thin film to the inside of the connecting hole is reduced, and as a result, the step coverage of the metal thin film resistor is raised.

Here, the sidewall formed on the inner wall of the connecting hole can be made of a material that contains argon (Ar). The sidewall containing argon can be formed, for example, by an etching process of Ar sputter etching technology (called reverse sputtering processing) after forming the connecting hole in the insulating film on the wiring pattern. By performing the etching process according to the Ar sputter etching technology to the insulating film after forming the connecting hole, the sidewall is formed on the inner wall of the connecting hole, and simultaneously, the upper part of the connecting hole is formed in the shape of a taper. Further, this process removes insulating substance formed on the upper surface of the wiring pattern at the bottom of the connecting hole. Further, the metal thin film resistor conventionally has a problem in that the resistance varies with variances of a ground film, such as a composition variance of the ground film, a variance with an elapsed time from formation of the ground film, and the like. The etching process of the Ar sputter etching technology performed on the insulating film for forming the sidewall inside the connecting hole before forming the metal thin film for forming the metal thin film resistor on the insulating film mitigates the influence of the ground film on the sheet resistance of the metal thin film resistor and reduces the variation of the resistance with the passage of time. In this manner, the resistance of the metal thin film resistor is stabilized.

Nevertheless, the present invention is not limited to the semiconductor device, the sidewall of which contains argon. Rather, the material of the sidewall can be an insulating material that does not contain argon, such as an oxidization silicon film and a silicon nitride film, and a conductive material such as tungsten.

As shown by actual examples, the film thickness of the metal thin film resistor of the semiconductor device according to the present invention ranges between 5 and 1000 Å, preferably, 20 and 500 Å.

As described above, according to the semiconductor device of the present invention, it is not necessary to perform patterning by wet etching technology after forming the metal thin film resistor. Further, the contact surface between the wiring pattern and the metal thin film resistor is not exposed to the atmosphere. Accordingly, a stable and satisfactory electrical connection between the metal thin film resistor and the wiring pattern is obtained, even if the surface oxide film removal process is not performed, and the barrier film is not formed for preventing the metal thin film resistor from being etched. Further, the step coverage of the metal thin film resistor inside the connecting hole is raised. In this manner, the present invention offers the semiconductor device having the metal thin film resistor of the above film thickness, wherein miniaturization of the metal thin film resistor and stabilization of the resistance are realized without increasing the number of process steps.

An aspect of the present invention provides the semiconductor device wherein the insulating film is flattened. This is desirable because the flattened insulating film prevents the resistance value from fluctuating due to a level difference of the insulating film that serves as the ground film of the metal thin film resistor.

Further, it is desirable that the wiring pattern of the semiconductor device of the present invention be constituted by a metal pattern and a high melting point metal film formed at least on the upper surface of the metal pattern; or alternatively, by a poly silicon pattern and a high melting point metal film formed at least on the upper surface of the poly silicon pattern. In this manner, without increasing the number of manufacturing process steps, the high melting point metal film can be arranged between the metal thin film resistor and the wiring pattern made of one of the metal pattern and the poly silicon pattern. Accordingly, the variances of the contact resistance of the metal thin film resistor and the wiring pattern are reduced, precision of the resistance is obtained, and the production yield is raised. Further, in the conventional structure where the metal thin film resistor directly touches the metal wiring, the contact resistance sharply changes by a low-temperature heat process at about 300 to 400° C.; however, according to the present invention, the wiring pattern consists of the metal pattern and the high melting point metal film, and the high melting point metal film is arranged between the metal thin film resistor and the metal pattern. For this reason, the fault as described above (the contact resistance sharply changing) can be avoided.

Further, the semiconductor device according to another aspect of the present invention includes a metal nitride film that covers the upper surface of the metal thin film resistor. In this case, it is desirable that no metal oxide film be formed between the upper surface of the metal thin film resistor and the metal nitride film. In this manner, oxidization of the upper surface of the metal thin film resistor is prevented from occurring, and the resistance of the metal thin film resistor is stabilized with improvement in precision.

Further, in the semiconductor device according to another aspect of the present invention, the wiring pattern is the wiring pattern of the top layer. By arranging the metal thin film resistor on the wiring pattern of the top layer, the flexibility in designing is enhanced, e.g., a layout of the metal thin film resistor can be changed by changing a layout of the top layer wiring pattern and the metal thin film resistor.

Further, by arranging the metal thin film resistor on the insulating film formed on the wiring pattern of the top layer, a last protective coat that consists of an insulating material is formed on the metal thin film resistor. This reduces the film thickness of the insulating material on the metal thin film resistor, and reduces variances of the film thickness compared with the case where an insulating film other than the last protective coat is formed on the metal thin film resistor. According to this arrangement, when a laser is irradiated to the metal thin film resistor for a trimming process, variation of the laser energy provided to the metal thin film resistor can be made small, because the variation of interference of the laser at the insulating material on the metal thin film resistor can be reduced. For this reason, an accurate trimming process can be carried out. Further, according to this arrangement, heat dissipation capacity can be raised, which helps reduce the temperature rise of the metal thin film resistor resulting from the laser irradiation at the trimming process.

An example, to which the semiconductor device of the present invention is applied, is a semiconductor device that includes a resistive potential divider using two or more resistors such that an input voltage is divided and the divided voltage is output; and the divided voltage that is output is adjusted by disconnecting (trimming) a fusing element. The resistors that constitute the resistive potential divider are the metal thin film resistors of the semiconductor device according to the present invention.

According to the metal thin film resistor of the semiconductor device of the present invention, since miniaturization of the resistor and stabilization of resistance can be attained, the formation area of the voltage diving circuit can be reduced, and the accuracy of the output voltage is improved.

Another example to which the present invention is applied is a semiconductor device serving as a voltage detecting circuit that includes the resistive potential divider, a reference voltage generating circuit that generates a reference voltage, and a comparing circuit configured to compare the divided voltage output from the resistive potential divider with the reference voltage provided by the reference voltage generating circuit. The resistive potential divider of the voltage detecting circuit employs the resistor constituted by the metal thin film resistor of the semiconductor device according to the present invention.

Since the resistive potential divider using the metal thin film resistor of the semiconductor device according to the present invention can be miniaturized, and can provide an accurate output voltage, the voltage detecting circuit also can be made small, and is capable of accurately detecting a voltage.

Further, another example that uses the semiconductor device of the present invention is a semiconductor device that generates a constant voltage. The constant voltage generating semiconductor device includes an output driver that controls an output of an input voltage, the resistive potential divider that divides the output voltage and supplies the divided voltage, the comparing circuit that compares the reference voltage provided by the reference voltage generating circuit with the divided voltage, and controls operations of the output driver based on a comparison result. Here, the resistive potential divider of the constant voltage generating circuit includes the resistor constituted by the metal thin film resistor of the semiconductor device of the present invention.

Since the resistive potential divider using the metal thin film resistor of the semiconductor device according to the present invention can be miniaturized, and can provide an accurate output voltage, the constant voltage generating circuit also can be made small, and is capable of providing stable output voltage.

Effect of the Invention

The metal thin film resistor of the semiconductor device according to the present invention is electrically connected to the wiring pattern through the connecting hole formed in the insulating film corresponding to the wiring pattern formed below the metal thin film resistor. For this reason, a patterning process using the wet etching technology is not required after forming the metal thin film resistor. Further, since a process of removing the surface oxide film is not required, a barrier film formation for preventing the metal thin film resistor from being etched is not required to obtain the stable and satisfactory electrical connection between the metal thin film resistor and the wiring pattern. In this manner, miniaturization of the metal thin film resistor and stabilization of the resistance are realized regardless of the thickness of the metal thin film resistor without increasing the number of process steps.

Further, according to the semiconductor device of the present invention, the sidewall is formed on the inner wall of the connecting hole for electrically connecting the metal thin film resistor and the wiring pattern. In this way, the step coverage of the metal thin film resistor inside the connecting hole is raised, and the contact resistance between the wiring pattern and the metal thin film resistor is stabilized.

Further, by forming the upper part of the connecting hole in the taper shape, an overhang of the metal thin film deposited near the upper part of the connecting hole is prevented from occurring when forming the metal thin film. Accordingly, undesired influence to the deposition of the metal thin film to the inside of the connecting hole is reduced, and as a result, the step coverage of the metal thin film resistor is raised.

Further, by arranging the sidewall formed inside the connection hole with a material that contains argon, the upper part of the connecting hole can be formed in the taper shape by the etching processing using Ar sputter etching technology. The process also removes the insulating substance formed on the wiring pattern in the connecting hole. Further, the etching process using the Ar sputter etching technology performed on the insulating film for formation of the sidewall inside, etc., also reduces the ground film effect on the sheet resistance of the metal thin film resistor, and mitigates variance with the passage of time. Accordingly, the resistance value of the metal thin film resistor is stabilized.

Further, by flattening the insulating film serving as the ground film of the metal thin film resistor, the resistance variance of the metal thin film resistor due to the level difference of the insulating film is prevented from occurring.

Further, the wiring pattern of the semiconductor device of the present invention is constituted by a metal pattern and a high melting point metal film formed at least on the upper surface of the metal pattern; or alternatively, by a poly silicon pattern and a high melting point metal film formed at least on the upper surface of the poly silicon pattern. In this manner, without increasing the number of manufacturing process steps, the high melting point metal film can be arranged between the metal thin film resistor and the wiring pattern made of one of the metal pattern and the poly silicon pattern. Accordingly, the variances of the contact resistance of the metal thin film resistor and the wiring pattern are reduced, precision of the resistance is obtained, and the production yield is raised. Further, in the conventional structure where the metal thin film resistor directly touches the metal wiring, the problem is that the contact resistance sharply changes by a low-temperature heat process at about 300 to 400 degrees C. The problem is solved by the present invention.

Further, by arranging the metal nitride film that covers the upper surface of the metal thin film resistor such that a metal oxide film is prevented from forming between the upper surface of the metal thin film resistor and the metal nitride film, the resistance of the metal thin film resistor is stabilized, and accuracy of the resistance is improved.

Further, by making the wiring pattern electrically connected to the metal thin film resistor to be a wiring pattern of the top layer, design flexibility is enhanced. Further, compared with the case where an insulating film other than the last protective coat is formed in the upper layer of the metal thin film resistor, the film thickness of the insulating material on the metal thin film resistor can be made small, reducing the film thickness variances, and the accuracy of trimming is raised. Further, heat dissipation capacity is raised, which helps reduce the temperature rise of the metal thin film resistor resulting from the laser irradiation at the time of trimming processing.

Further, the present invention provides application examples wherein the semiconductor device having the metal thin film resistor according to the present invention is applied to the resistive potential dividing semiconductor device, the voltage detecting semiconductor device, and the constant voltage generating semiconductor device. Accordingly, these semiconductor devices can be made small, and can provide accurate dividing voltage output, voltage detecting capability, and stable constant voltage, respectively.

BRIEF DESCRIPTION OF THE DRAWINGS

FIGS. 3A-3E give cross-sectional drawings for explaining an example of the second half of the manufacturing processes of the metal thin film resistor according to the embodiment;

FIGS. 26A-26F are a cross-sectional drawing for explaining another example of the conventional manufacturing method;

DESCRIPTION OF THE PREFERRED EMBODIMENTS

In the following, embodiments of the present invention are described with reference to the accompanying drawings.

Embodiments of the Present Invention

Figure 1A:
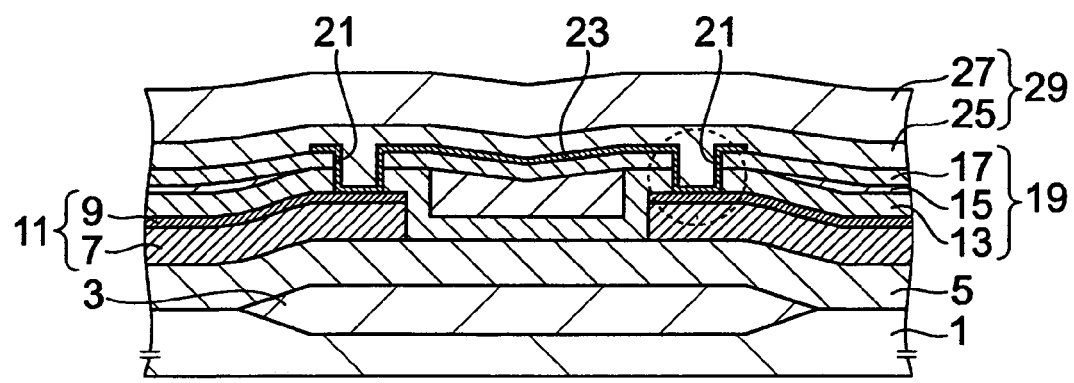
FIGS. 1A and 1B give cross-sectional drawings showing an embodiment of the present invention, wherein a cross-sectional view of a formation area of a metal thin film resistor is given at (A), and a detailed cross-sectional view of the metal thin film resistor formation area is given at (B), expanding the portion surrounded by a circle with a dashed line in (A)
Figure 1B:
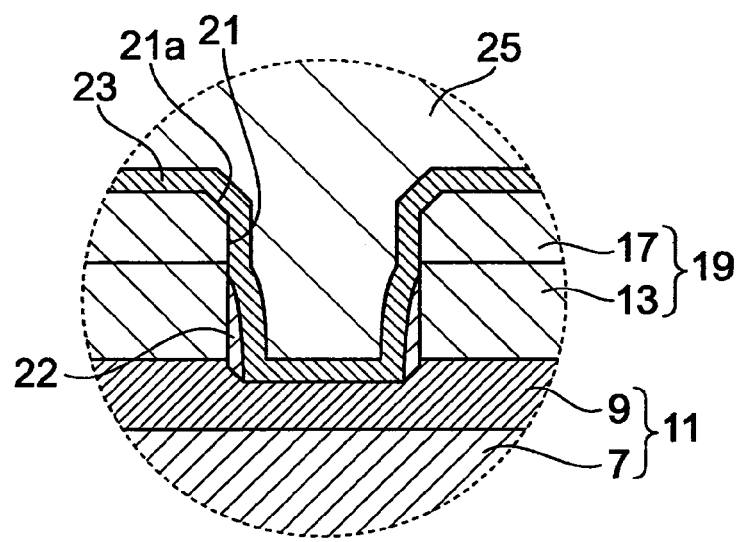

FIGS. 1A and 1B give cross-sectional drawings showing the embodiment of the present invention, wherein a cross-sectional view of a formation area of a metal thin film resistor is provided at (A), and an expanded cross-sectional drawing is provided at (B), showing a portion surrounded by a circle with a dashed line at (A). Although a transistor, a capacitor, etc., are formed on the same substrate as the metal thin film resistor in the embodiments described below, illustration of these elements is omitted.

A device separating oxide film 3 is formed on a silicon substrate 1. On the silicon substrate 1 including the formation area of the device separating oxide film 3, a first interlayer insulating film 5 (ground insulating film) consisting of a BPSG film or a PSG (phospho silicate glass) film is formed. On the first interlayer insulating film 5, a wiring pattern 11 is formed, which wiring pattern includes a metal pattern 7, and a high melting point metal film 9 formed on the surface of the metal pattern 7. The metal pattern 7 is made of, for example, an AlSiCu film. The high melting point metal film 9 is made of, for example, a TiN film, and functions as a barrier film and as an antireflection film.

On the first interlayer insulating film 5 including the formation area of the wiring pattern 11, a second interlayer insulating film 19 (insulating film) is formed, which is constituted by a plasma CVD oxide film 13, an SOG film 15, and a plasma CVD oxide film 17 in this sequence from bottom to top. Connecting holes 21 are formed in the second interlayer insulating film 19 at positions corresponding to both ends of the metal thin film resistor and the wiring pattern 11.

As shown at (B), the connecting holes 21 are formed with a part the surface of the high melting point metal film 9 being removed, and the upper part 21a of each connecting hole 21 is formed in a taper form. Further, a sidewall 22 is formed on the inner wall of each connecting hole 21. The taper formed at the upper part 21a and the sidewall 22 of each connecting hole 21 are formed by, for example, an Ar sputter etching process carried out on the second interlayer insulating film 19 in which the connecting holes 21 are formed. Therefore, the sidewall 22 contains the material of the high melting point metal film 9 and the second interlayer insulating film 19, and Ar, that is, the sidewall 22 contains Ti, N, Si, O, and Ar.

A CrSi thin film resistor 23 (metal thin film resistor) is formed on the second interlayer insulating film 19 at an area between the connecting holes 21, inside each connecting hole 21, and on the wiring pattern 11. Each end of the CrSi thin film resistor 23 is electrically connected to the wiring pattern 11 in the respective connecting holes 21.

A passivation film 29 serving as the last protective coat constituted by a silicon oxide film 25 on the lower layer side, and a silicon nitride 27 film on the upper layer side is formed on the second interlayer insulating film 19 including the formation area of the CrSi thin film resistor 23.

As shown in FIG. 1B, since the sidewall 22 is formed on the inner wall of each connecting hole 21, step coverage of the CrSi thin film resistor 23 within the connecting hole 21 is improved. In this manner, the contact resistance between the wiring pattern 11 and the CrSi thin film resistor 23 is stabilized.

Further, since the upper part 21a of the connecting hole 21 is formed in the taper shape, an overhang of the CrSi thin film deposited near the upper part 21a of the connecting hole 21 is prevented from occurring when forming the CrSi thin film for forming the CrSi thin film resistor 23. Accordingly, undesired influence to the deposition of the CrSi thin film to the inside of the connecting hole 21 is reduced, and as a result, the step coverage of the CrSi thin film, and therefore, the step coverage of the CrSi thin film resistor 23 can be raised.

Figure 4:
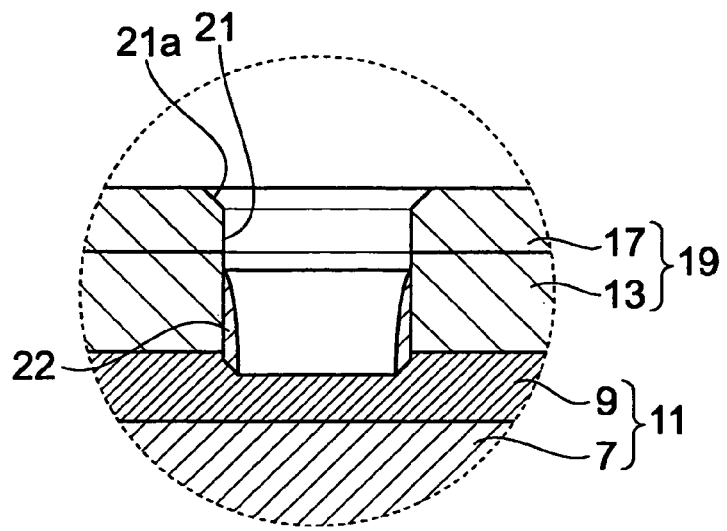
FIG. 4 is a cross-sectional drawing showing a connecting hole and its neighborhood after performing an Ar sputter etching process of the manufacturing processes.

FIGS. 2A-2F and FIGS. 3A-3E give cross-sectional drawings for explaining an example of manufacturing processes according to the embodiment described with reference to FIGS. 1A and 1B. Further, FIG. 4 shows details of the connecting hole and its neighborhood after an Ar sputter etching process is performed. In FIGS. 2A-2F and FIGS. 3A-3E, the sidewall formed on the inner wall of the connecting hole, and the taper formed on the upper part of the connecting hole are not illustrated. The example of the manufacturing processes is described with reference to FIG. 1A through FIG. 4.

(1) The first interlayer insulating film 5 consisting of a BPSG film or a PSG film, having a thickness of about 8000 Å, is formed on the silicon substrate 1 in the shape of a wafer on which a transistor element, etc. (illustration is omitted) and the device separating oxide film 3 have been formed using, for example, normal pressure CVD equipment. Then, the surface of the first interlayer insulating film 5 is flattened by a heat treatment such as a reflow process (refer to FIG. 2A).

(2) Then, a metal film 31 for wiring that consists of an AlSiCu film that is about 5000 Å thick is formed on the first interlayer insulating film 5 using, e.g., DC magnetron sputtering equipment. Further, a high melting point metal film 33 serving as an antireflection film is formed on the metal film 31 for wiring. Here, a TiN film that is about 800 Å is continuously formed in a vacuum according to a well-known technology (refer to FIG. 2B). Since the high melting point metal film 33 also functions as a barrier film for stabilizing the contact resistance between the metal thin film resistor and the metal pattern formed from the metal film 31 for wiring at a back process, it is desirable that the metal film 31 for wiring and the high melting point metal film 33 be continuously formed in a vacuum.

Figure 2A:
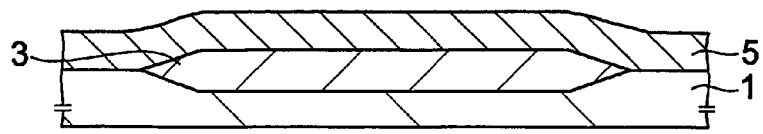
FIGS. 2A-2F give cross-sectional drawings for explaining an example of the first half of manufacturing processes of the metal thin film resistor according to the embodiment.
Figure 2B:
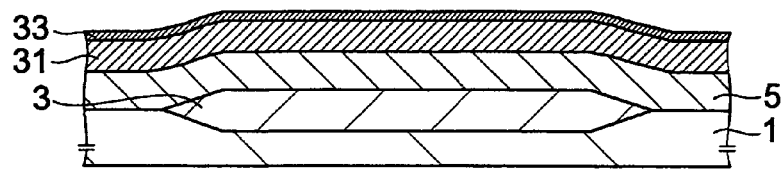
Figure 2C:
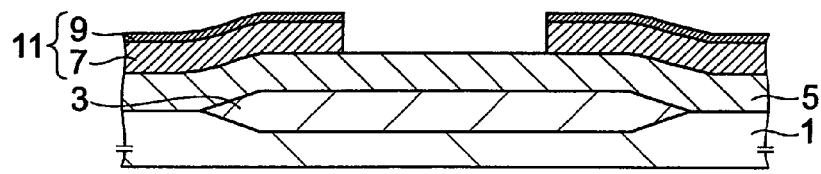

(3) The high melting point metal film 33 and the metal film 31 for wiring are patterned by a well-known photoengraving process technology and etching technology, and the wiring pattern 11 that consists of the metal wiring pattern 7 and the high melting point metal film 9 is formed (refer to FIG. 2C). Since the high melting point metal film 33 that functions as the antireflection film is formed on the metal film 31 for wiring at this time, growing and shrinking of a resist pattern for demarcating the formation area of the wiring pattern 11 is reduced to a minimum.

Further, since the metal thin film resistor has not been formed at this stage, unlike the conventional technology, but the ground film of the wiring pattern 11 is formed by the first interlayer insulating film 5, the high melting point metal film 33 and the metal film 31 for wiring can be patterned with sufficient over-etching of the dry etching technology. That is, there is no need for applying the wet etching technology, use of which is one of the problems of the conventional technology in that miniaturization cannot be furthered.

Figure 2D:
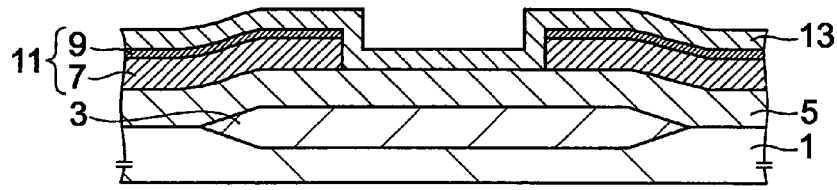
Figure 2E:
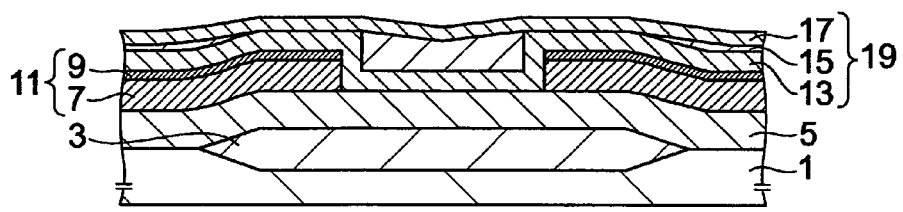
Figure 2F:
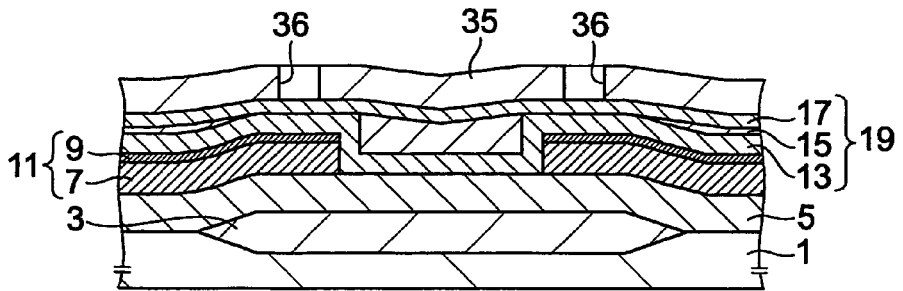

(4) The plasma CVD oxide film 13 that is about 6000 Å thick is formed on the first interlayer insulating film 5 including the formation area of the wiring pattern 11 using, e.g., a plasma CVD method (refer to FIG. 2D).

(5) The SOG film 15 is formed on the plasma CVD oxide film 13, and is flattened by a coating process and an etch back process of SOG, which processes are well known. Then, the plasma CVD oxide film 17 that is about 2000 Å thick is formed such that diffusion of components from the SOG film 15 is prevented from occurring. In this manner, the second interlayer insulating film 19 consisting of the plasma CVD oxide film 13, the SOG film 15, and the plasma CVD oxide film 17, is formed (refer to FIG. 2E).

(6) A resist pattern 35 is formed by a well-known photoengraving process. The resist pattern 35 is for forming the connecting holes 21 in the second interlayer insulating film 19, and covers areas where both ends of the metal thin film resistor are planned to come and corresponding to the wiring pattern 11. Openings 36 are formed in the resist pattern 35 corresponding to the planned formation area of both ends of the metal thin film resistor and the wiring pattern 11 (refer to FIG. 2F).

(7) The connecting holes 21 are formed in the second interlayer insulating film 19 by selectively removing the second interlayer insulating film 19 by, for example, parallel flat-plate type plasma etching equipment, the resist pattern 35 serving as a mask. The etching is performed under conditions of RF power being 700 W, Ar being 500 sccm (standard cc/minute), $CHF_3$ being 500 sccm, $CF_4$ being 500 sccm, and pressure being 3.5 Torr. At the bottom of each connecting hole 21, the high melting point metal film 9 that is about 600 Å thick remains functioning as the barrier and the antireflection film.

Then, the resist pattern 35 is removed (refer to Section FIG. 3A).

After formation of the connecting holes 21, a removal process may be carried out to remove byproducts adhering to the sidewalls of the connecting holes 21 at the time of etching. Further, in order to improve the step coverage of the metal thin film resistor inside the connecting holes 21, a taper etching process with different etching conditions, and an etching processing that combines the wet etching technology and the dry etching technology may be performed such that the shape of the connecting holes 21 is improved.

Further, at the process (7) described above, by optimizing the plasma etching conditions, the etching rate of the high melting point metal film 9 can be reduced while maintaining the etching rate of the second interlayer insulating film 19. In this manner, the thickness of the high melting point metal film 9 that remains at the bottom of the connecting holes 21 can be made greater than this example of the manufacturing processes. Further, while the thickness is kept small when forming the high melting point metal film 9, it is possible to keep a sufficient thickness of the high melting point metal film 9 remaining after the formation of the connecting holes 21. Since the process (7) of forming the connecting holes 21 is performed before the metal thin film resistor is formed, processing of the connecting holes 21 is possible without restrictions resulting from the thinness of the metal thin film resistor, which enables further pursuit of miniaturization using the dry etching technology to the fullest extent.

(8) Then, an Ar sputter etching process is carried out to the surface of the second interlayer insulating film 19 including the inside of the connecting holes 21. Here, the Ar sputter etching process is carried out in a vacuum, for example, in an Ar sputter etching chamber of multi-chamber sputtering equipment, conditions being DC bias: 1250 V, Ar: 20 sccm, pressure: 8.5 mTorr, and processing time: 20 seconds.

The etching conditions are equivalent to etching about 50 Å of a thermal oxidation film formed in wet atmosphere at 1000° C. The thickness of the high melting point metal film 9 that remains at the bottom of the connecting holes 21 after performing this process is about 500 Å.

Then, following the completion of the Ar sputter etching process, keeping the vacuum state, a CrSi thin film (metal thin film) 37 for forming a metal thin film resistor is formed. The semiconductor wafer is transported from the Ar sputter etching chamber to a sputter chamber that is equipped with a CrSi target, which CrSi target is composed of Si/Cr=80/20 wt % (percentage by weight). The CrSi sputtering process is performed under conditions as follows; DC power: 0.7 kW, Ar: 85 sccm, pressure: 8.5 mTorr, and processing time: 9 seconds, and the CrSi thin film 37 that is about 50 Å thick is formed all over the second interlayer insulating film 19 including the inside of the connecting holes 21 (refer to FIG. 3B).

In this way, the Ar sputter etching process is performed on the second interlayer insulating film 19 including the inside of the connecting holes 21 before forming the CrSi thin film 37 for the metal thin film resistor. For this reason, the sidewall 22 that contains Ar, and materials of the high melting point metal film 9 and the second interlayer insulating film 19 is formed on the inner wall of the connecting holes 21, and the upper part 21a of the connecting holes 21 can be formed in the taper shape as shown in FIG. 4.

Further, by performing the Ar sputter etching process, a minute formation of a natural oxide film on the surface of the high melting point metal film 9 at the bottom of the connecting holes 21 can be removed such that the electrical connection between the wiring pattern 11 and the CrSi thin film 37 is improved.

Further, by performing the Ar sputter etching process, dependability of the CrSi thin film resistor formed from the CrSi thin film 37 at a back process on the ground film is improved. This effect is described below.

(9) A resist pattern 39 for demarcating the formation area of the metal thin film resistor is formed on the CrSi thin film 37 by the photoengraving process technology. Then, a CrSi thin film resistor 23 is formed by patterning the CrSi thin film 37 using, for example, RIE (reactive ion etching) equipment, where the resist pattern 39 is used as a mask (refer to FIG. 3C).

(10) The resist pattern 39 is removed (refer to FIG. 3D). Here, the CrSi thin film resistor 23 is electrically connected to the wiring pattern 11 in the connecting holes 21, dispensing with a metal oxide film removal process of the surface of the CrSi thin film resistor 23 by hydrofluoric acid, which removal process is conventionally required in order to establish an electrical connection on the upper surface of the metal thin film resistor.

(11) The silicon oxide film 25 and the silicon nitride film 27 constituting the passivation film 29 are sequentially formed on the second interlayer insulating film 19 including the formation area of the CrSi thin film resistor 23 by, e.g., the plasma CVD method. This completes the manufacturing processes of the semiconductor device of the present embodiment (refer to FIGS. 1A and 1B and FIG. 3E).

According to the manufacturing method described above, the wiring pattern 11 and the connecting holes 21 are formed before forming the CrSi thin film resistor 23, and the electrical connection between the CrSi thin film resistor 23 and the wiring pattern 11 is formed within the connecting holes 21. For this reason, it is not necessary to perform patterning by the wet etching technology after carrying out patterning of the CrSi thin film resistor 23.

Further, since the contact surface of the wiring pattern 11 and the CrSi thin film resistor 23 is not exposed to the atmosphere, a stable and satisfactory electrical connection between the CrSi thin film resistor 23 and the wiring pattern 11 is obtained without the surface oxide film removal process, and without forming the barrier film for protecting the CrSi thin film resistor 23 from etching.

Accordingly, miniaturization of the CrSi thin film resistor 23, and stabilization of the resistance are realized regardless of the thickness of the CrSi thin film resistor 23 without increasing the number of process steps.

Further, since the high melting point metal film 9 that functions as a barrier film is formed between the CrSi thin film resistor 23 and the metal pattern 7, variations of the contact resistance between the CrSi thin film resistor 23 and the wiring pattern 11 are reduced, precision of the resistance value is obtained, and improvement in the production yield is attained.

Further, since the high melting point metal film 9 functions also as an antireflection film, and can be formed without increasing the number of manufacturing process steps, the contact resistance between the metal thin film resistor and the wiring pattern can be stabilized without increasing the manufacturing cost as compared with the conventional technology.

Figure 5:
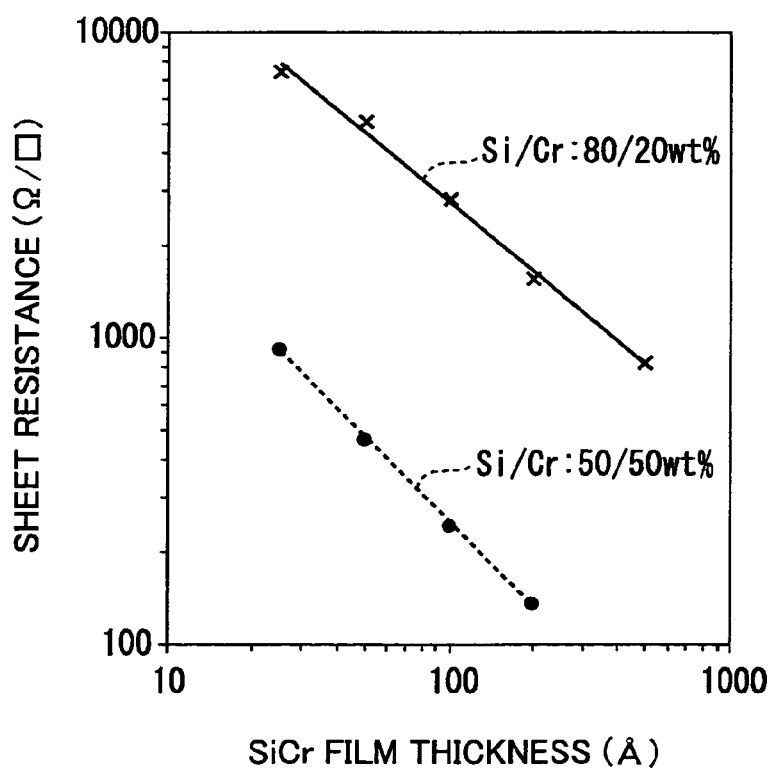
FIG. 5 is a graph showing relations between sheet resistance and film thickness of the metal thin film resistor according to the present invention, wherein the vertical axis shows the sheet resistance ($\Omega$/sq), and the horizontal axis shows the film thickness of CrSi (Å)
Figure 6:
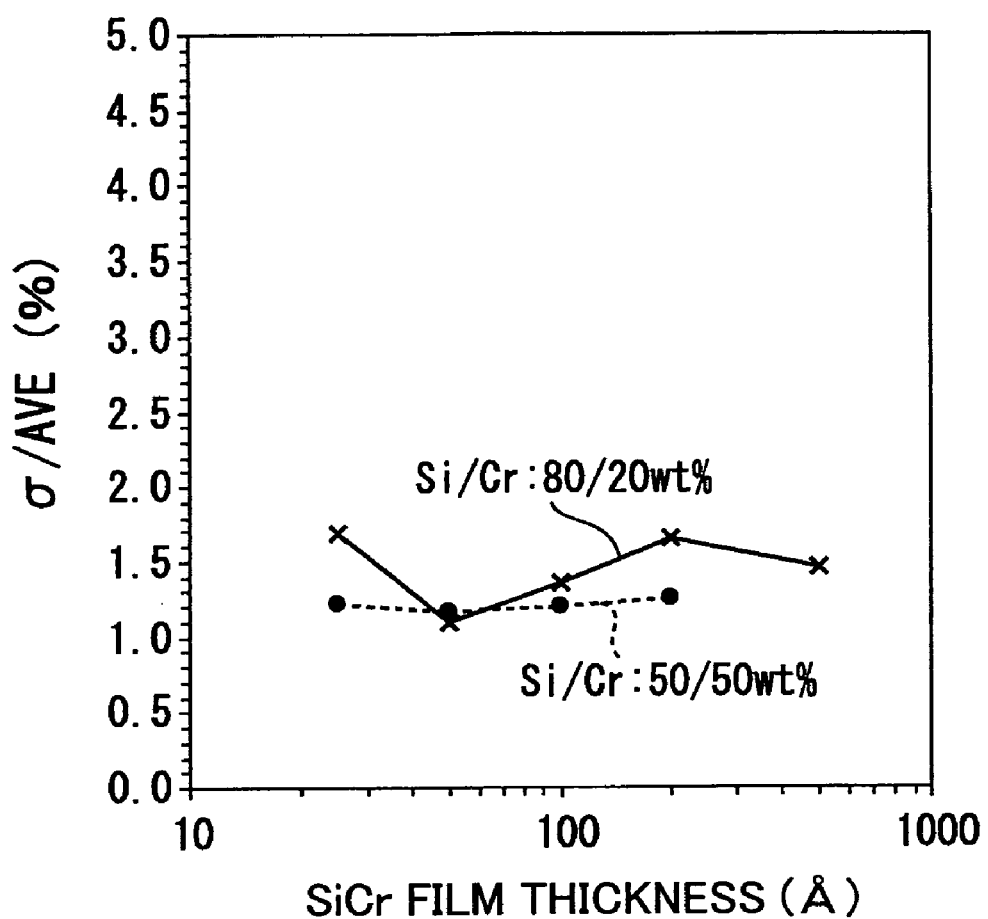
FIG. 6 is a graph showing relations between the value ($\sigma$/AVE) and the film thickness, the value being a ratio of the standard deviation ($\sigma$) of sheet resistance values measured at 63 points of a wafer of the metal thin film resistor according to the present invention to an average (AVE) of the 63 values, wherein the vertical axis shows the value $\sigma$/AVE (%), and the horizontal axis shows the film thickness of CrSi (Å)

Properties of the metal thin film resistor that was formed according to the embodiment are described with reference to FIG. 5 and FIG. 6. In FIG. 5, relations between the sheet resistance and the thickness of the metal thin film resistor are shown, wherein the vertical axis shows the sheet resistance ($\Omega$/sq), and the horizontal axis shows the thickness of the CrSi film (Å). FIG. 6 shows relations between a value ($\sigma$/AVE) and the thickness of the CrSi film, the value being a ratio of the standard deviation ($\sigma$) to the average (AVE) of sheet resistance values measured at 63 points of the wafer of the metal thin film resistor, wherein the vertical axis shows $\sigma$/AVE (%), and the horizontal axis shows the thickness of the CrSi film (Å).

The metal thin film resistor was formed under the following conditions.

Samples of the CrSi thin film were produced to film thickness of 25 through 500 Å with two kinds of targets, namely Si/Cr=50/50 wt %, and 80/20 wt %, by adjusting volume-time using multi-chamber sputtering equipment, except that a sample with Si/Cr=50/50 wt % having the film thickness of 500 Å was not produced. Other conditions were DC power: 0.7 kW, Ar: 85 sccm, and pressure: 8.5 mTorr.

Further, the Ar sputter etching processing was performed before forming the CrSi thin film using the multi chamber sputtering equipment under conditions of DC-bias: 1250 V, Ar: 20 sccm, pressure: 8.5 mTorr, and processing time: 160 seconds. This process is equivalent to removing 400 Å of a thermal oxidation film formed in wet atmosphere at 1000° C.

Further, an AlSiCu film that is 5000 Å thick is used as a lower layer metal wiring that is connected to the metal thin film resistor, but the TiN film was not formed on the AlSiCu film at the bottom of the connecting holes between the AlSiCu film and the CrSi thin film.

The sheet resistance was measured by a 2-terminal method, wherein 20 stripe patterns were arranged at intervals of 0.5 μm, each pattern being 0.5 μm wide and 50 μm long, and a voltage of 1 V was applied to both ends of one of the metal thin film resistors that were arranged, and the current was measured.

Further, the plane dimensions of the connecting hole that connects the metal wiring and the CrSi thin film resistor were 0.6 μm×0.6 μm.

As shown by FIG. 5, the relations between the film thickness and the sheet resistance were linear regardless of the composition of the target (namely, Si/Cr=50/50 wt %, and Si/Cr=80/20 wt %) for a thickness range between less than 200 A and greater than 25 A. That is, the metal thin film resistor that is small and thin was realized by the present invention, which cannot be formed by the conventional technology.

FIG. 6 shows variances of the sheet resistance values at 63 places on the wafer. As seen from FIG. 6, the variances in the sheet resistance was hardly influenced by the film thickness, and the variance of the sheet resistance proved to be very small and stable with either of the targets (Si/Cr=50/50 wt %, and Si/Cr=80/20 wt %). By employing the Ar sputter etching as the formation method of the sidewall inside the connecting hole as described above, the miniaturized metal thin film resistor pattern can be stably formed regardless of the thickness of the metal thin film resistor.

Figure 7A:
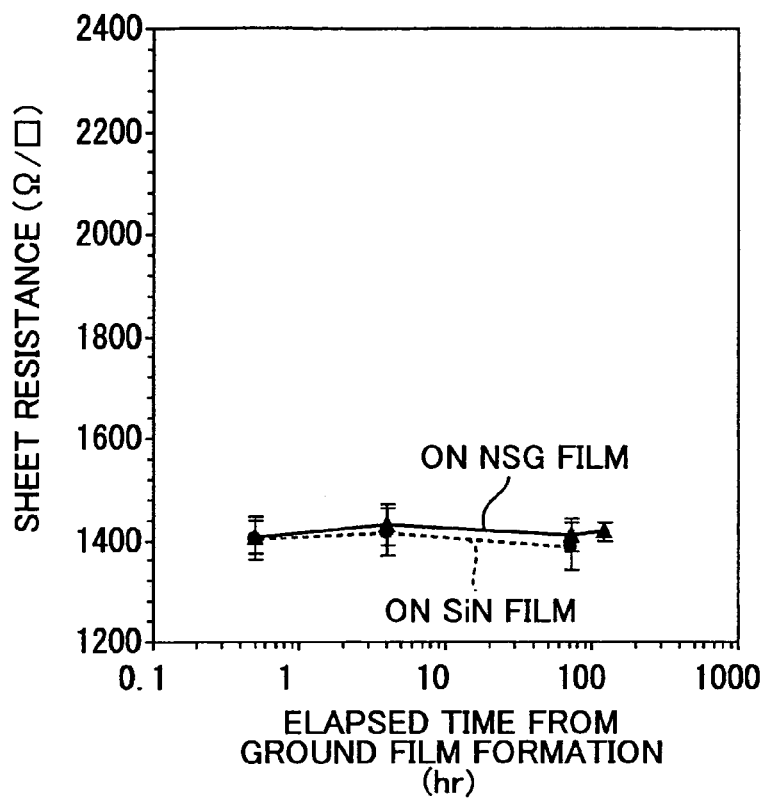
FIGS. 7A-7B give graphs showing relations between the sheet resistance of the CrSi thin film resistor and the elapse of time that has passed after forming the ground film of the metal thin film resistor, wherein the case where Ar sputter etching process is performed before forming the metal thin film for the metal thin film resistor is given at (A), and the case where the Ar sputter etching process is not performed before forming the metal thin film for the metal thin film resistor is given at (B). The vertical axis shows the sheet resistance (Ω/sq), and the horizontal axis shows the elapsed time after the ground film is formed (hours)
Figure 7B:
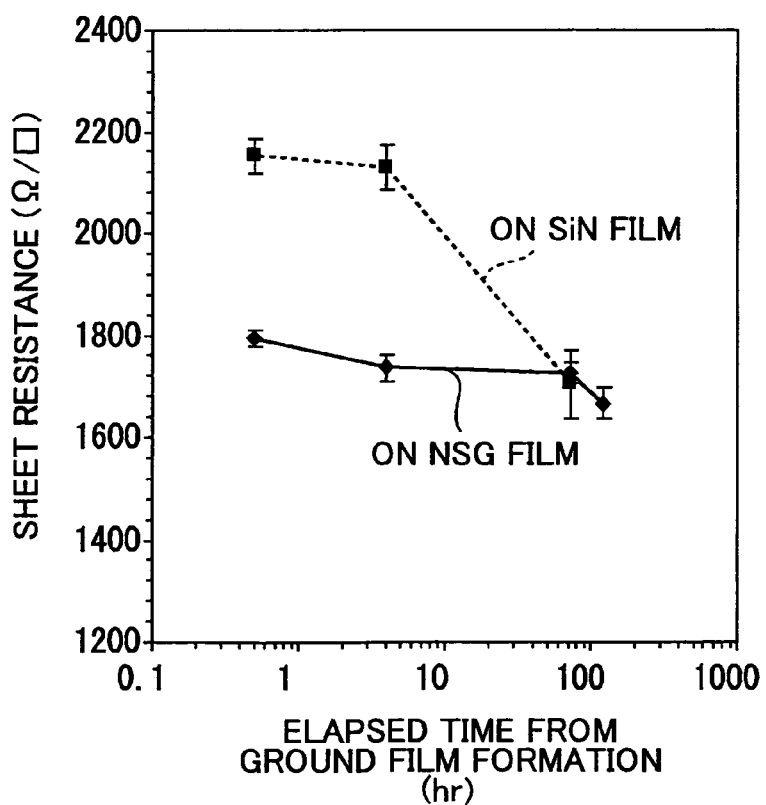

FIGS. 7A-7B give graphs that show relations between the sheet resistance of the CrSi thin film resistor and the time that has passed after forming the ground film. In FIG. 7A, the case wherein the Ar sputter etching process was performed before forming the metal thin film for the metal thin film resistor is shown. At (B), the case wherein the Ar sputter etching process was not performed is shown. In FIGS. 7A-7B, the vertical axis shows the sheet resistance (Ω/sq), and the horizontal axis shows the elapsed time after ground film formation (hours).

Samples concerning (measurement results of which are shown in) FIGS. 7A-7B were made from two kinds of silicon wafers, one having a 2000 Å thick plasma SiN film and the other having a 2000 Å thick plasma NSG (non-doped silicate glass) film formed on the ground film by the plasma CVD method, and CrSi thin film resistors were formed on each silicon wafer, values of which CrSi thin film resistor were measured by a 4-terminal method.

The plasma SiN film of the ground film was formed using parallel flat-plate type plasma CVD equipment under the following conditions temperature: 360° C., pressure: 5.5 Torr, RF power: 200 W, $SiH_4$: 70 sccm, N2: 3500 sccm, and $NH_3$: 40 sccm.

The plasma NSG film was formed using the parallel flat-plate type plasma CVD equipment under the following constitutions: temperature: 400° C., pressure: 3.0 Torr, RF power: 250 W, $SiH_4$: 16 sccm, and $N_2O$: 1000 sccm.

The CrSi thin film resistors were formed in 100 Å thickness using the multi-chamber sputtering equipment under the following conditions: target: Si/Cr=80/20 wt %, DC power: 0.7 kW, Ar: 85 sccm, pressure: 8.5 mTorr, and volume-time: 13 seconds.

As for the samples shown at (A), the Ar sputter etching process was performed using the multi-chamber sputtering equipment under the following conditions: DC-bias: 1250 V, Ar: 20 sccm, pressure: 8.5 mTorr, and processing time: 80 seconds. The conditions are equivalent to carrying out etching removal of 200 Å of a thermal oxidation film formed in wet atmosphere at 1000° C.

As shown in (B), where the Ar sputter etching process was omitted before formation of the CrSi thin film, the sheet resistance remarkably varies with differences in the ground film, i.e., whether the SiN film or the NSG film. Further, the sheet resistance was greatly affected by the time that passed after forming the ground film before forming the CrSi thin film resistor.

On the other hand, as shown in (A), where the Ar sputter etching process was performed, the sheet resistance of the CrSi thin film resistor was not greatly affected by the kind of ground film, nor by the elapsed time from the ground film formation.

As described above, the variations of the resistance due to the difference of the ground films, the elapsed time from a previous process, and the like are remarkably improved by forming the metal thin film for the metal thin film resistor in the vacuum immediately after performing the Ar sputter etching process.

Figure 8:
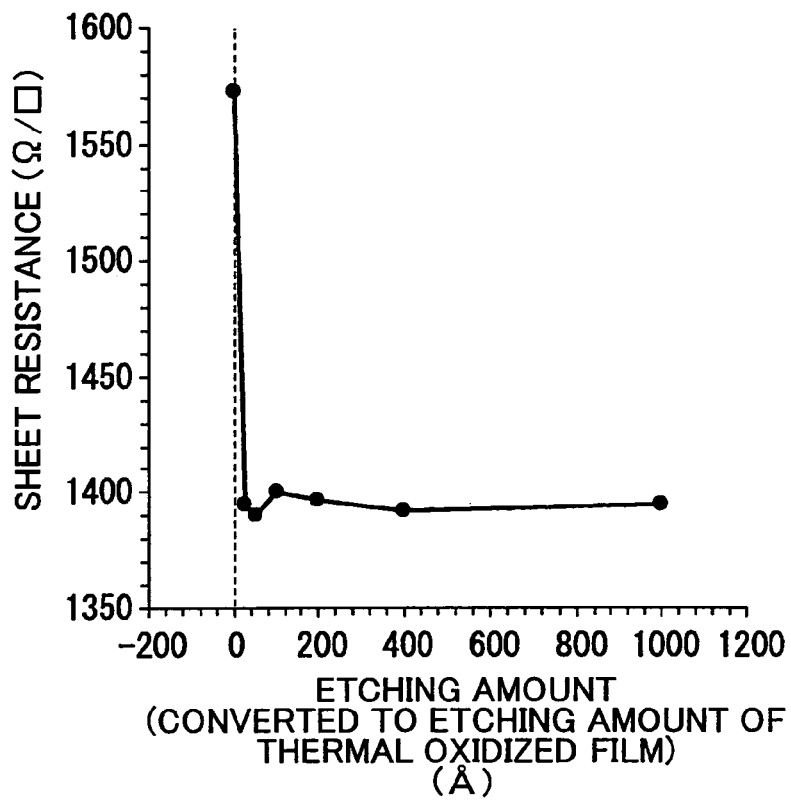
FIG. 8 is a graph showing relations between the amount of Ar sputter etching and the sheet resistance, wherein the vertical axis shows sheet resistance (Ω/sq), and the horizontal axis shows the amount of etching (Å) (converted to the amount of thermal oxidation film etching)

FIG. 8 shows relations between the amount of Ar sputter etching and the sheet resistance. The vertical axis shows the sheet resistance (Ω/sq), and the horizontal axis shows the amount of etching (converted to thermal oxidation film etching amount) (Å). As for the samples concerning FIG. 8, the same plasma NSG film and the same CrSi thin film resistor that were formed as the samples concerning FIGS. 7A-7B were used. Here, the CrSi thin film resistor was formed on the plasma NSG film one week after the Ar sputter etching process was performed on the plasma NSG film. The conditions of the Ar sputter etching were the same the samples concerning FIGS. 7A-7B except that the amount of etching was a variable. The amount of etching was adjusted to 0 Å (with no Ar sputter etching), 25 Å, 50 Å, 100 Å, 200 Å, 400 Å, and 1000 Å, as converted to the etching amount of a thermal oxidation film formed in wet atmosphere. The sheet resistance of the CrSi thin film resistor was measured by the 4-terminal method.

From the results shown by FIG. 8, it turned out that the sheet resistance of the CrSi thin film resistor became stable if the Ar sputter etching mount was 25 Å or greater (as converted to the etching amount of a thermal oxidation film formed in wet atmosphere). Here, although the etching amount of the samples ranged up to 1000 Å as shown in FIG. 8, it was expected that the effect of the Ar sputter etching was available in the case of the etching amount being greater than 1000 Å so long as the ground film remains at the formation area of the metal thin film resistor.

Further, it turned out that the effect of the Ar sputter etching process favorably affected not only the influence of the ground film, but also the stability of the resistance of the CrSi thin film.

Figure 9:
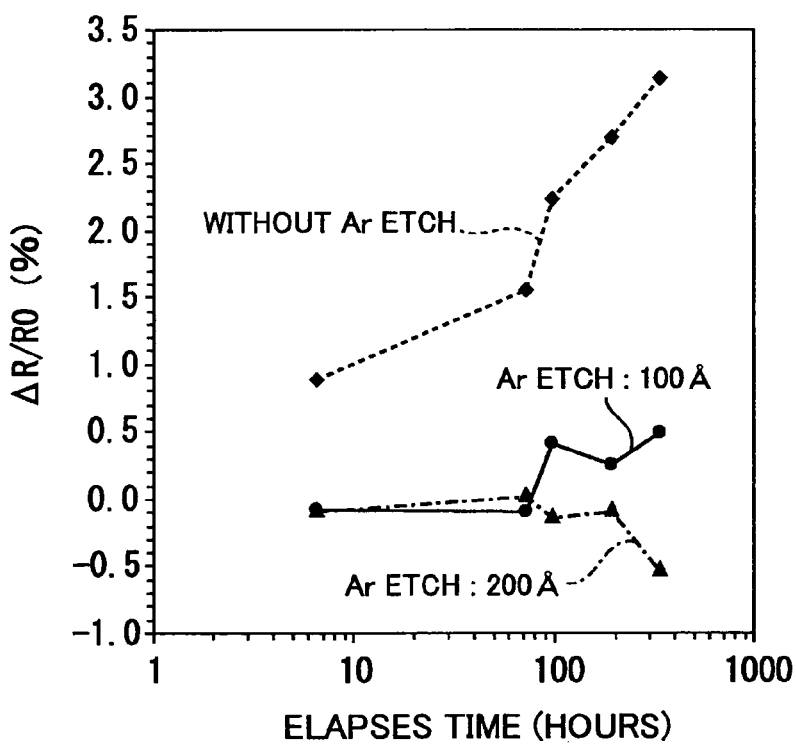
FIG. 9 is a graph showing relations between the rate of change (ΔR/R0) of the sheet resistance from the sheet resistance immediately after formation of the metal thin film resistor, and the elapse of time the metal thin film resistor is left in the atmosphere at the temperature of 25° C. and 45% humidity after forming the CrSi thin film. The vertical axis shows ΔR/R0 (%), and the horizontal axis shows the elapse of time (hours).

FIG. 9 shows relations between a rate of change (ΔR/R0) of the sheet resistance from the sheet resistance immediately after formation (R0) and the time the CrSi thin film is left in the atmosphere at a temperature of 25° C. and 45% humidity after forming the CrSi thin film. In FIG. 9, the vertical axis shows ΔR/R0 (%), and the horizontal axis shows the time (hours).

As for samples concerning FIG. 9, the same plasma NSG film and the same CrSi thin film resistor as the respective samples concerning FIGS. 7A-7B were used.

About the Ar sputter etching, three kinds of the samples were prepared, namely, no etching, process time 40 seconds for 100 Å etching, and process time 80 seconds for 200 Å, the etching amounts having been converted to a thermal oxidation film.

As for the sample with no Ar sputter etching process, the sheet resistance rose as the time passed after formation, the ratio ΔR/R0 reaching 3% or greater when the sample was left for 300 hours or more.

On the other hand, with the samples that were etched by 100 Å and 200 Å by the Ar sputter etching process, the ratio ΔR/R0 was within ±1% after leaving the samples for 300 hours or more after formation.

Comparing the sample etched by 100 Å with the sample etched by 200 Å, the difference was small, and it turned out that a small amount of Ar sputter etching was sufficient.

As described above, the favorable effect of the Ar sputter etching process to the influence to the sheet resistance of the ground film, and the influence of the time is described with reference to FIG. 5 through FIG. 9. The effect, however, is not limited to the samples of the CrSi thin film resistors, wherein the target composition ratios were Si/Cr=80/20 wt % and 50/50 wt %. Rather, the same effect as the above was obtained with all the CrSi thin films and CrSiN films formed with targets, composition of which ranged between Si/Cr=50/50 and 90/10 wt %.

Further, the Ar sputter etching method is not limited to the DC-bias sputter etching method that was used here.

Figure 10:
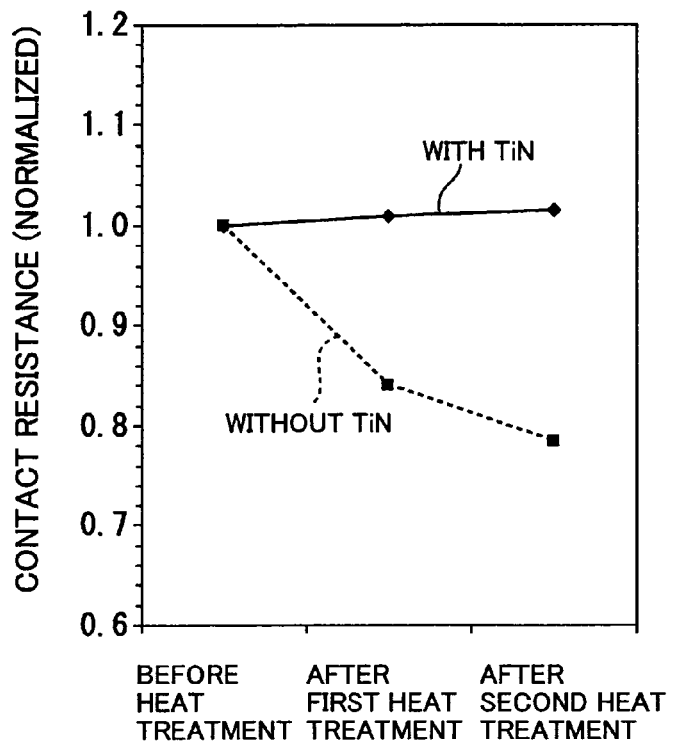
FIG. 10 is a graph showing the change of contact resistance between the metal thin film resistor and metal wiring, the change being due to heat treatment in the case wherein a high melting point metal film (TiN) remains at the bottom of the connecting hole, and in the case wherein no high melting point metals remain. The vertical axis shows the contact resistance value that is normalized by an initial contact resistance value before the heat treatment, and the horizontal axis shows the number of times of heat treatment.

FIG. 10 shows changes in the contact resistance between the metal thin film resistor and the metal wiring in two cases, the changes being due to a heat treatment. The first case is the case where the high melting point metal film remains at the bottom of the connecting hole when forming the connecting hole, and the second is the case where the high melting point metal film is completely removed. The vertical axis shows the contact resistance values that are normalized by the contact resistance value before heat treatment, and the horizontal axis shows the number of times of the heat treatments.

A sample for the first case, with reference to FIG. 10, was made such that about 500 Å of the high melting point metal film remain at the bottom of the connecting hole, and a sample for the second case was made such that the high melting point metal film is completely removed by adjusting the dry etching time when forming the connecting hole.

The. TiN film was used as the high melting point metal film.

The CrSi thin film resistor was formed in 50 Å thickness under the following conditions: Si/Cr=80/20 wt %, DC power: 0.7 kW, Ar: 85 sccm, pressure: 8.5 mTorr, and volume-time: 6 seconds.

The Ar sputter etching process before forming the CrSi thin film was performed under the following conditions: DC bias: 1250 V, Ar: 20 sccm, pressure: 8.5 mTorr, and processing time: 160 seconds. This process is equivalent to carrying out an etching removal by 400 Å of a thermal oxidation film formed in wet atmosphere at 1000° C.

The plane dimensions of the connecting hole were 0.6 µm×0.6 µm. The contact resistance was measured using the 4-terminal method.

The samples were heated for 30 minutes in a 350° C. nitrogen atmosphere, and the contact resistances were measured.

In the case of the first sample with the TiN film remaining at the bottom of the connecting hole, the contact resistance hardly changed after two heat treatments as compared with before the heat treatments. On the other hand, in the case of the second sample where the TiN film was completely removed, the contact resistances after heat treatments were greater by more than 20% compared with the contact resistance before the heat treatments. It means that the TiN film functions as a barrier film that prevents the resistance from changing by an interaction of the CrSi thin film and the metal wiring.

By providing the TiN film between the CrSi thin film resistor and the metal wiring, the contact resistance variation due to the heat treatment, such as sintering, and CVD, is suppressed, and further, the contact resistance change is suppressed in a soldering process performed afterwards in an assembly work of a product. In this manner, while the contact resistance at a desired value is stably obtained, variation of the contact resistance before and after the assembly work can be prevented from occurring. Accordingly, high precision and an enhanced production yield of the product are attained.

By the manufacturing processes described with reference to FIG. 1A through FIG. 4, at the process (2), the metal film 31 for wiring and the high melting point metal film 33 are continuously formed in the vacuum; however, the manufacturing method is not limited to this.

For example, in the case that the metal film 31 for wiring is first formed, and exposed to the atmosphere, and then the high melting point metal film 33 is formed, a natural oxide film is formed on the surface of the metal film 31 for wiring making it difficult to obtain an electric flow between the metal film 31 for wiring and the high melting point metal film 33.

In this case, the electrical connection between the wiring pattern 11 and the CrSi thin film resistor 23 can be obtained by removing all the high melting point metal film 9 at the bottom of the connecting hole 21 when forming the connecting hole 21 in the second interlayer insulating film 19. The second interlayer insulating film 19 is on the wiring pattern 11 that consists of the high melting point metal film 9 and the metal pattern 7 that is formed by patterning the metal film 31 for wiring and the high melting point metal film 33.

Further, at the process (2), although the high melting point metal film 33 that functions as the barrier film and the anti-reflection film is formed in 800 Å thickness, the manufacturing method is not limited to this. Here, generally, a high melting point metal film serving as the antireflection film is formed in a thickness of 500 Å or less; however, when the high melting point metal film 9 is desired to remain at the bottom of the connecting hole 21 as the barrier film, it is desirable to form the high melting point metal film in the thickness of 500 Å or greater in anticipation that the thickness of the high melting point metal film 9 decreases due to the over-etching when forming the connecting hole 21 (refer to the process (7)), and the Ar sputter etching process when forming the metal thin film (refer to the process (8)).

Nevertheless, by optimizing the etching conditions, and the Ar sputter etching conditions for forming the connection hole 21 as described above, it is possible to minimize the decrease in the thickness of the high melting point metal film 9 such that the high melting point metal film 9 still functions as the barrier film with the thickness of 500 Å or less.

Further, in the process (8), the Ar sputter etching process is performed immediately before forming the CrSi thin film 37. However, when the high melting point metal film 9 functioning as the barrier film remains at the bottom of the connecting hole 21, since the high melting point metal film 9 consisting of the TiN film, unlike the AlSiCu film, does not form a firm natural oxide film even if it is exposed to the atmosphere, a satisfactory electrical connection between the CrSi thin film 37 and the wiring pattern 11 is obtained without performing the Ar sputter etching process. In this case, in order to improve the step coverage of the CrSi thin film 37 in the connecting hole 21, a process of forming the sidewall in the connecting hole 21 is required. However, since the stability of the resistance of the CrSi thin film resistor 23 is improved by performing the Ar sputter etching process immediately before forming the CrSi thin film 37 as mentioned above, it is desirable that the Ar sputter etching process be performed after forming the sidewall in the connecting hole 21.

Further, although the SOG film 15 that is formed and flattened by etching back is used as the second interlayer insulating film 19 in the embodiment, the insulating film used as the ground of the metal thin film resistor is not limited to this. Other insulating films, such as an insulating film that is flattened by the publicly known CMP (chemical mechanical polish) technology, and a plasma CVD oxide film that is not flattened, can serve as the ground of the metal thin film resistor. Nevertheless, analog resistors are used not only as TCR, but also in a configuration where pair properties and precision of the resistance ratio are important. Accordingly, in the case that the metal thin film resistor of the semiconductor device of the present invention is to be applied to an analog resistor, it is desired that the insulating film serving as the ground of the metal thin film resistor be flattened.

Figure 11A:
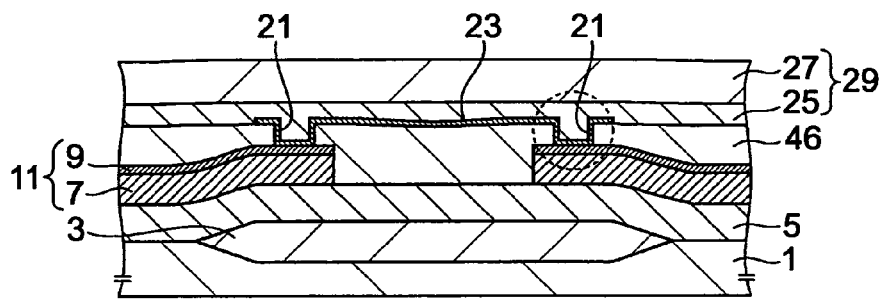
FIGS. 11A-11B give cross-sectional drawings showing the formation area of the metal thin film resistor according to another embodiment of the present invention at (A), and an expanded cross-sectional view at (B) detailing a portion surrounded by a circle with a dashed line at (A)
Figure 11B:
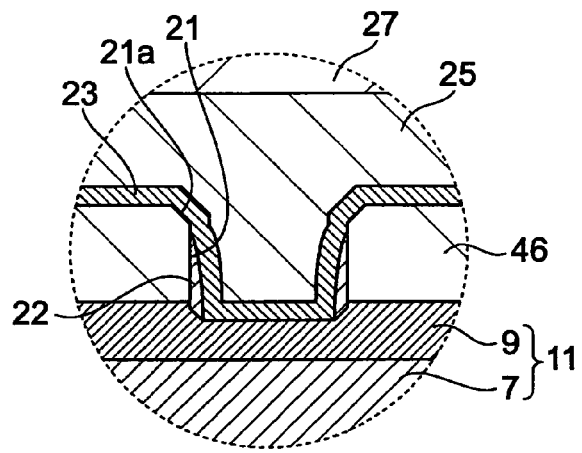

FIGS. 11A-11B give cross-sectional drawings, in which the insulating film used as the ground of the metal thin film resistor is different from the embodiment described above. In FIG. 11A, the formation area of the metal thin film resistor is shown, and at (B), an expanded cross-sectional drawing shows an expanded view of the portion surrounded by a circle with a dashed line at (A). The same reference marks are given to the portions that achieve the same functions as FIGS. 1A and 1B, and detailed explanation of those portions is not repeated.

The device separating oxide film 3, the first interlayer insulating film 5, the wiring pattern 11 that consists of the metal pattern 7 and the high melting point metal film 9 are formed on the silicon substrate 1.

A second interlayer insulating film 44 consisting of an SOG film is formed on the first interlayer insulating film 5 including the formation area of the wiring pattern 11. The connecting holes 21 are formed in the second interlayer insulating film 19 corresponding to both ends of the metal thin film resistor and wiring pattern 11.

As shown at (B), the bottom of each connecting hole 21 is formed by removing a part of the surface of the high melting point metal film 9, and the upper part 21a of the connecting hole 21 is formed in the taper form. The sidewall 22 and the upper part 21a of the connecting hole 21 are formed by performing the Ar sputter etching process for forming the second interlayer insulating film 44 in which the connecting holes 21 are formed. The sidewall 22 contains the material of the high melting point metal film 9 and the second interlayer insulating film 44, and Ar. Specifically, in the present embodiment, Ti, N, Si, O, and Ar are contained.

The CrSi thin film resistor 23 is formed in the area between the connecting holes 21 on the second interlayer insulating film 44, the inside of the connecting hole 21, and on the wiring pattern 11. The passivation film 29 that consists of the silicon oxide film 25 and the silicon nitride film 27 is formed on the second interlayer insulating film 44 including the formation area of the CrSi thin film resistor 23.

The second interlayer insulating film 44 is formed by performing a heat treatment after applying the SOG to a thickness of 4000 Å. In this manner, the level difference of the surface of the second interlayer insulating film 44 that consists of the SOG film is mitigated.

Since the same sidewall 22 as the embodiment described with reference to FIGS. 1A and 1B is formed on the inner wall of the connecting hole 21 according to the present embodiment, stabilization of the contact resistance between the wiring pattern 11 and the CrSi thin film resistor 23 is attained, and since the upper part 21a of the connecting hole 21 is formed in the shape of the taper, the step coverage of the CrSi thin film resistor 23 is also raised.

Figure 12A:
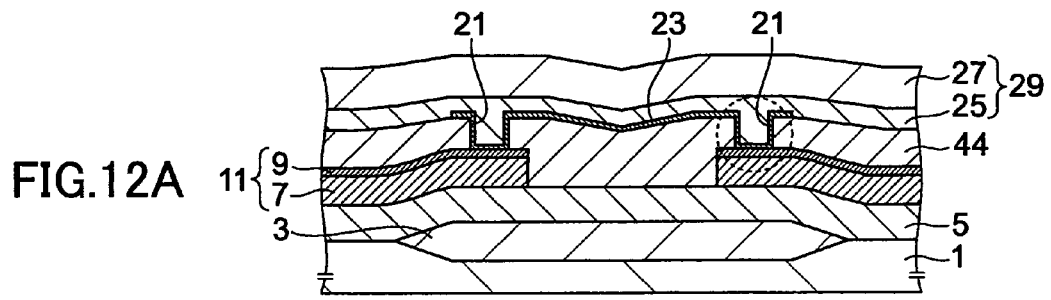
FIGS. 12A-12B give cross-sectional drawings showing the formation area of the metal thin film resistor according to another embodiment of the present invention at (A), and an expanded cross-sectional view at (B) detailing a portion surrounded by a circle with a dashed line at (A)
Figure 12B:
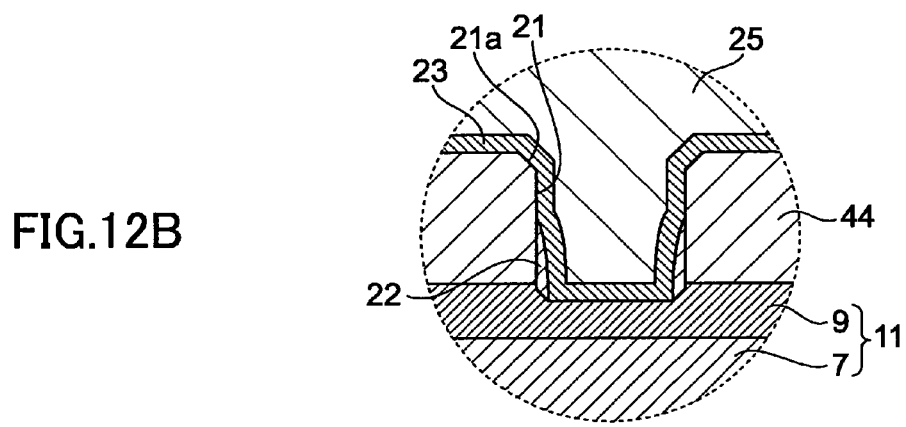

FIGS. 12A-12B give cross-sectional drawings for explaining another different embodiment of the semiconductor device, wherein the insulating film serving as the ground of the metal thin film resistor is different from the embodiments already described. In FIGS. 12A-12B, a cross-sectional drawing at (A) shows the formation area of the metal thin film resistor, and an expanded cross-sectional drawing at (B) shows an expanded view of the portion surrounded by a circle with a dashed line at (A). The same reference marks are given to the portions that achieve the same function as FIGS. 1A and 1B, and detailed description of those portions is not repeated.

The present embodiment differs from the embodiments described with reference to FIGS. 1A and 1B and FIGS. 11A-11B in that a second interlayer insulating film 46 is flattened by the CMP method. The material of the second interlayer insulating film 46 is, for example, a plasma CVD oxide film. In this manner, the flat nature of the second interlayer insulating film 46 that serves as the ground film of the CrSi thin film resistor 23 can be further raised.

The second interlayer insulating film 46 is formed, for example, by forming a plasma CVD oxide film in about 10000 Å thickness, and by grinding the film to about 4000 Å thickness by the CMP method such that it is flattened.

Further, according to the present embodiment, the sidewall 22 is formed on the inner wall of each connecting hole 21, which is the same as the embodiment described with reference to FIGS. 1A and 1B. Accordingly, stabilization of the contact resistance between the wiring pattern 11 and the CrSi thin film resistor 23 is obtained. Further, since the upper part 21a of the connecting hole 21 is formed in the shape of the taper, the step coverage of the CrSi thin film resistor 23 is raised.

Further, a CVD insulating film formed by an HDP (high-density-plasma)-CVD method may be used as the insulating film serving as the ground of the CrSi thin film resistor. For example, an insulating film with satisfactory flatness can be formed by first preparing a CVD insulating film by forming the HDP-CVD film in about 8000 Å thickness, and then carrying out an etch back process to about 4000 Å thickness. In this case, the sidewall that contains Ar, and the materials of the HDP-CVD film and the wiring pattern can be formed after forming the connecting holes in the HDP-CVD film by performing the Ar sputter etching process on the inner wall of each connecting hole. Further, the upper part of the connecting hole is formed in the taper form.

Further, although the passivation film 29 is formed on the CrSi thin film resistor 23 according to the present embodiment, the present invention not limited to this, but the film on the CrSi thin film resistor 23 may be any insulating film, such as an interlayer insulating film for forming a second layer metal wiring.

Figure 13A:
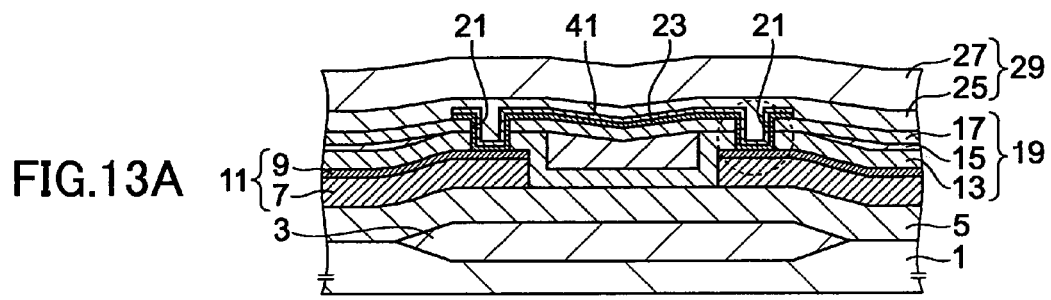
FIGS. 13A-13B give cross-sectional drawings showing the formation area of the metal thin film resistor according to another embodiment of the present invention at (A), and an expanded cross-sectional view at (B) detailing a portion surrounded by a circle with a dashed line at (A)
Figure 13B:
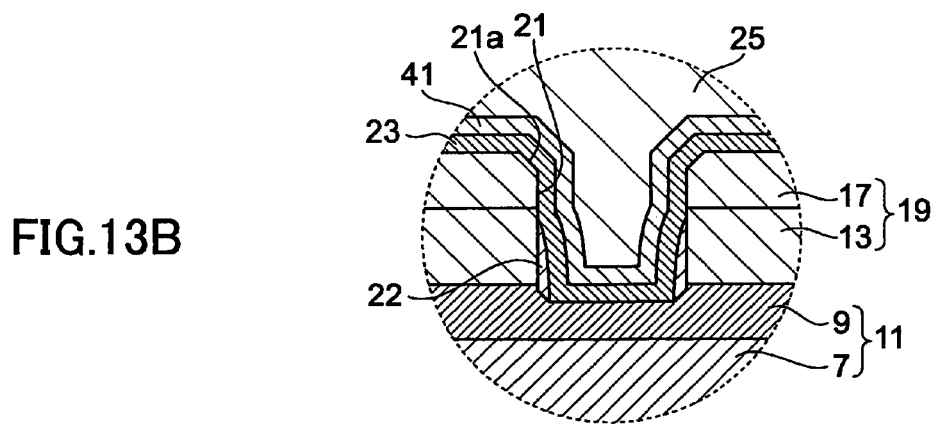

FIGS. 13A-13B give cross-sectional drawings showing another embodiment of the present invention. The cross-sectional drawing at (A) shows the formation area of the metal thin film resistor, and the cross-sectional drawing at (B) is an expanded view of the portion surrounded by a circle with a dashed line at (A). The same reference marks are given to the portions that achieve the same function as FIGS. 1A and 1B, and detailed explanation of those portions is not repeated.

On the silicon substrate 1, the device separating oxide film 3, the first interlayer insulating film 5, the wiring pattern 11 consisting of the metal pattern 7 and the high melting point metal film 9, and the second interlayer insulating film 19 consisting of the plasma CVD oxide film 13, the SOG film 15, and the plasma CVD oxide film 17 are formed. Further, the connecting holes 21 are formed in the second interlayer insulating film 19 corresponding to both ends of the metal thin film resistor and the wiring pattern 11. The sidewall 22 is formed on the inner wall of each connecting hole 21. The upper part 21a of each connecting hole 21 is formed in the taper form.

The CrSi thin film resistor 23 is formed on the second interlayer insulating film 19 in the area between the connecting holes 21, inside of each connecting hole 21, and on the wiring pattern 11. The CrSiN film 41 (metal nitride film) is formed on the upper surface of the CrSi thin film resistor 23. No CrSiO is formed between the CrSi thin film resistor 23 and the CrSiN film 41.

On the second interlayer insulating film 19 including the formation area of the CrSi thin film resistor 23, the passivation film 29 is formed, which is constituted by the silicon oxide-film 25 on the lower layer side, and the silicon nitride 27 on the upper layer side.

FIGS. 14A-14D give cross-sectional drawings for explaining an example of the manufacturing processes according to the embodiment described above with reference to FIGS. 13A-13B. In FIGS. 14A-14D, illustration is omitted as for the sidewall formed on the inner wall of each connecting hole, and the taper form of the upper part of the connecting hole. The example of the manufacturing processes is described with reference to FIGS. 13A-13B and FIGS. 14A-14D.

(1) By the same processes (1) through (7) as described above with reference to FIGS. 2A-2F and FIG. 3A, on the silicon substrate 1 in the shape of a wafer, to which formation of the device separating oxide film 3 is completed, the first interlayer insulating film 5, the wiring pattern 11 consisting of the metal wiring pattern 7 and the high melting point metal film 9, the second interlayer insulating film 19 consisting of the plasma CVD oxide film 13, the SOG film 15, and the plasma CVD oxide film 17 are formed. The connecting holes 21 are formed in the second interlayer insulating film 19 (refer to FIG. 14A).

(2) By the same process as the process (8) described with reference to FIG. 3B, the Ar sputter etching process is performed in the vacuum to the surface of the second interlayer insulating film 19 including the inside of each connecting hole 21, for example, in an Ar sputter etching chamber of multi-chamber sputtering equipment such that the side wall is formed to each connecting hole 21, and the upper part 21a is shaped in the taper form (refer to FIG. 13B), which is immediately followed by formation of the CrSi thin film 37 for forming the metal thin film resistor keeping the vacuum state.

Further, immediately following the formation of the CrSi thin film 37, the CrSiN film 43 is formed on the CrSi thin film 37 without breaking the vacuum state. Here, the CrSi target of Si/Cr=80/20 wt % that is used when forming the CrSi thin film 37 is used. Other process conditions are: DC power: 0.7 kW, Ar+N$_2$ (mixed gas of argon and nitrogen): 85 sccm, pressure: 8.5 mTorr, and processing time: 6 seconds. The CrSiN film 43 is formed on the CrSi thin film 37 at about 50 Å thickness (refer to FIG. 14B).

(3) By the same process as the process (9) described with reference to FIG. 3C, the resist pattern 39 for demarcating the formation area of the metal thin film resistor is formed on the CrSiN film 43 using the photoengraving technology. Then, patterning of the CrSiN film 43 and the CrSi thin film 37 is carried out, the resist pattern 39 serving as a mask, using RIE (reactive ion etching) equipment, and a laminate pattern consisting of the CrSiN film 41 and the CrSi thin film resistor 23 is formed (refer to FIG. 14C).

Figure 14A:
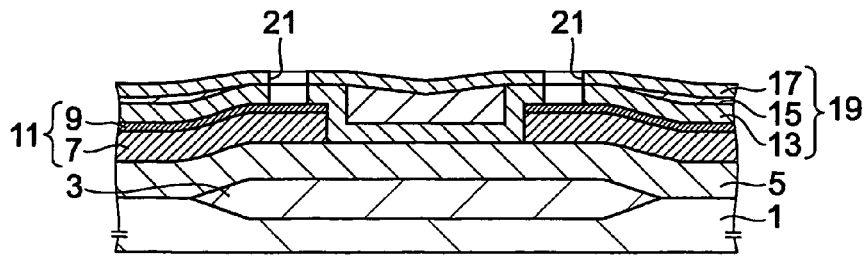
FIGS. 14A-14D give cross-sectional drawings for explaining an example of the manufacturing processes of this embodiment.
Figure 14B:
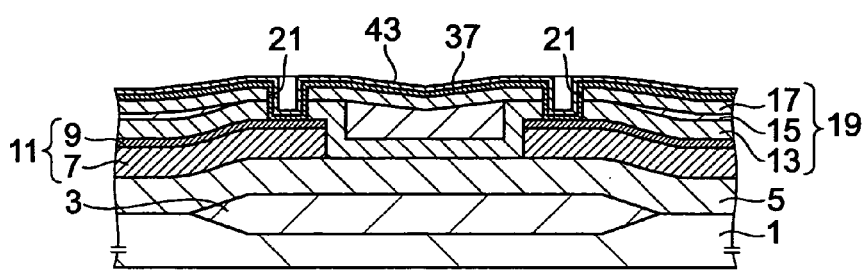
Figure 14C:
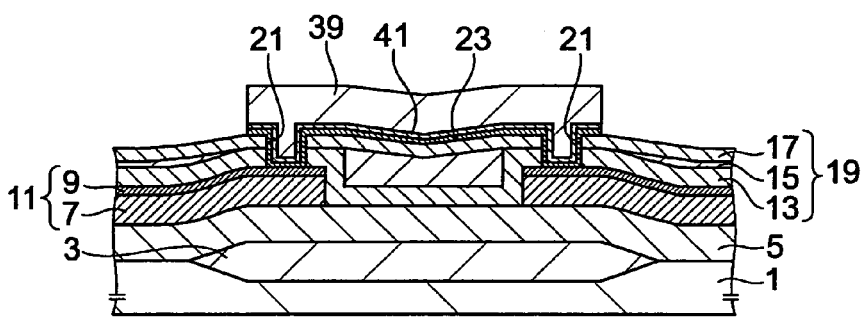
Figure 14D:
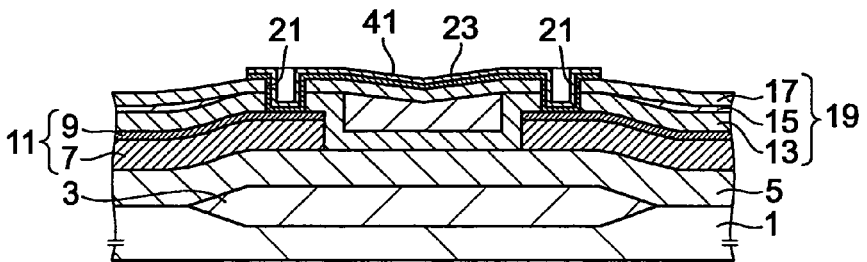

(4) The resist pattern 39 is removed (refer to FIG. 14D). As the embodiments already described, since the CrSi thin film resistor 23 is electrically connected to the wiring pattern 11, it is not necessary to perform a metal oxide-film removal process on the surface of the CrSi thin film resistor 23 by hydrofluoric acid, which process is required by the conventional technology. Further, since the CrSiN film 41 covers the upper surface of the CrSi thin film resistor 23, even if it is exposed to an atmosphere containing oxygen, such as air, the upper surface of the CrSi thin film resistor 23 is not oxidized.

Then, the passivation film 29 is formed on the second interlayer insulating film 19 including the formation area of the CrSi thin film resistor 23 and the CrSiN film 41 (refer to FIGS. 13A-13B).

It is generally known that a resistance value changes if a metal thin film is exposed to the atmosphere for a long time, the metal thin film having high reactivity to oxygen.

According to this embodiment, the upper surface of the CrSi thin film resistor 23 is not exposed to the atmosphere, since the upper surface of the CrSi thin film resistor 23 is covered by the CrSiN film 41, and the resistance of the CrSi thin film resistor 23 is made stable. Further, when the CrSi thin film 37 for forming the CrSi thin film resistor 23 is formed, the electrical connection between the CrSi thin film 37 and the wiring pattern 11 is completed. For this reason, even if a new thin film is formed on the CrSi thin film 37, the new thin film does not affect the property of the CrSi thin film 37.

Figure 15:
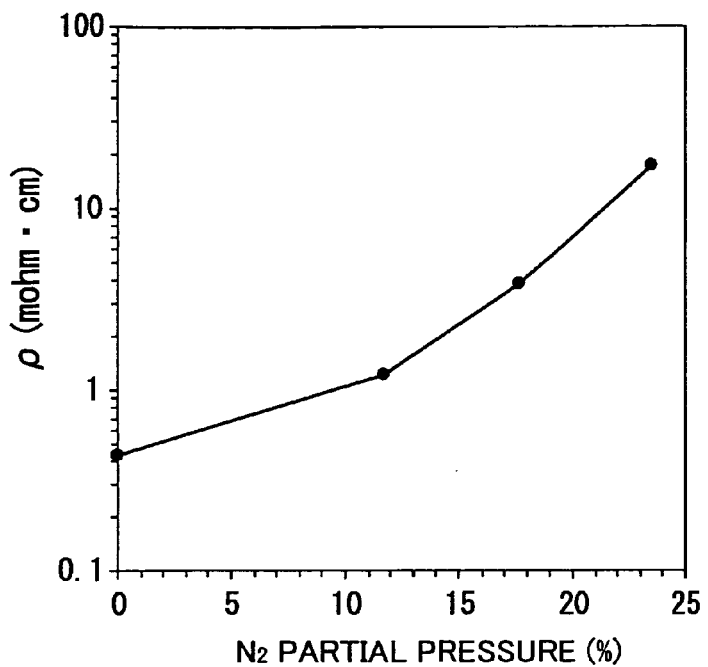
FIG. 15 is a graph showing relations between the resistance of a CrSiN film and partial pressure of N2 gas for CrSiN film formation, wherein the vertical axis shows resistance ρ(mΩ-cm), and the horizontal axis shows the $N_2$ gas partial pressure (%)

FIG. 15 shows relations between the resistance of the CrSiN film and partial pressure of the N$_2$ gas for CrSiN film formation, where the vertical axis shows the resistance ρ (mΩ-cm), and the horizontal axis shows the N$_2$ partial pressure (%). Here, the CrSiN film was formed under the following conditions: target: Si/Cr=50/50 wt %, DC power: 0.7 kW, Ar+N$_2$: 85 sccm, pressure: 8.5 mTorr, and processing time: 6 seconds, and the N$_2$ partial pressure of Ar+N$_2$ gas was made variable.

The CrSiN film formed by a reactive sputter process wherein N$_2$ partial pressure was 18% or greater showed high resistance of 10 times or greater compared with the case where the N$_2$ partial pressure was 0%, i.e., where no N$_2$ gas was used. Accordingly, if the N$_2$ partial pressure is set up at 18% or greater, even if the CrSiN film is formed directly on the CrSi thin film resistor, the resistance of the whole CrSi thin film resistor is determined by the CrSi thin film, since the CrSiN film hardly affects the resistance. Here, the greatest of the N$_2$ partial pressures is about 90%, since the N$_2$ partial pressure greater than 90% causes a sharp fall of the sputtering speed, and production efficiency falls.

In addition, if the CrSiN film is formed by the reactive sputter with the N$_2$ partial pressure being about 6 to 11%, for example, the CrSiN film can serve as the metal thin film resistor.

Further, although the CrSiN film 41 is formed on the CrSi thin film resistor 23 in the present embodiment, a CVD system insulating film, e.g., a silicon nitride film may be formed on the CrSi thin film resistor 23. However, a CVD chamber is not usually connected to common multi-chamber sputter equipment, and in order to form the CVD system insulating film continuously in the vacuum on the CrSi thin film resistor 23, a new investment may be necessary, causing an increase in the manufacturing cost.

If the CrSiN film 43 is formed on the CrSi thin film 37 for the CrSi thin film resistor 23 as the present embodiment teaches, existing multi-chamber sputter equipment, without purchasing new equipment, can form the CrSiN film 43 that serves as an oxidization protection cover film for the CrSi thin film resistor 23 without breaking the vacuum state.

Although the above embodiment is described about the case that uses the TiN film as the high melting point metal films 9 and 33, the high melting point metal film that constitutes the wiring pattern is not limited to this, but other high melting point metal films such as TiW and WSi may be used.

Further, although the embodiment applies the present invention to the semiconductor device wherein the metal wiring is served by the wiring pattern 11 that is single-layered, the present invention is not limited to this, but can also apply to a semiconductor device of a multilayer metal wiring structure. In this case, the lower layer metal wiring of a metal thin film resistor for obtaining the electrical connection of the metal thin film resistor may be metal wiring of any layer position of the layers. If the lower layer wiring pattern (metal wiring) of the metal thin film resistor that is electrically connected to the metal thin film resistor is made to be the wiring pattern of the top layer when applying the present invention to the semiconductor device of multilevel metal wiring structure, the flexibility of design is realizable. For example, a layout of the metal thin film resistors can be changed by changing a layout of the top layer wiring pattern of the metal thin film resistors. Further, by arranging the metal thin film resistor on the insulating film formed on the wiring pattern of the top layer, the last protective coat of an insulating material is formed on the upper layer of the metal thin film resistor. In this case, the film thickness of the insulating material on the metal thin film resistor can be made thin, and variation of the film thickness can be made small, compared with the case where an insulating film other than the last protective coat is formed on the upper layer of the metal thin film resistor. In this manner, when a laser is irradiated to the metal thin film resistor in order to perform a trimming process, variation in interference of the laser to the insulating material on the metal thin film resistor is made small, and variation in the laser energy provided to the metal thin film resistor can be made small. Accordingly, accuracy of trimming can be raised. Further, heat dissipation capacity can be raised when the temperature of the metal thin film resistor rises resulting from the laser irradiation when performing the trimming process, etc.

Further, although the wiring pattern 11 of the embodiments is described as being served by the high melting point metal film 9 formed on the upper surface of the metal pattern 7, the present invention is not limited to this, but the wiring pattern may be constituted by a metal pattern without a high melting point metal film being formed on the upper surface. In this case, since a firm natural oxide film is formed on the surface of the metal pattern when, for example, aluminum system alloy is used as the metal pattern, it is desirable to perform a process that removes the natural oxide film of the metal pattern surface at the bottom of the connecting hole after forming the connecting hole and before forming the metal thin film for forming the metal thin film resistor. The natural oxide film removal process may also serve as the Ar sputter etching process aiming at suppression of the resistance change with time of the metal thin film resistor. Further, the material of the wiring pattern is not limited to the aluminum system alloy, but the wiring pattern can be made of other metals such as Cu wiring formed by the so-called damascene method.

Further, although the wiring pattern 11 of the embodiments for taking a potential of the CrSi thin film resistor 23 is described as being constituted by the metal pattern 7 and the high melting point metal film 9, the metal pattern 7 may be replaced by a poly silicon pattern.

Figure 16A:
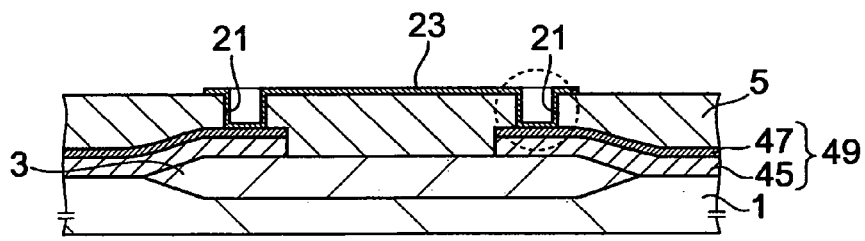
FIGS. 16A-16B give cross-sectional drawings showing the formation area of the metal thin film resistor according to another embodiment of the present invention at (A), and an expanded cross-sectional view at (B) detailing a portion surrounded by a circle with a dashed line at (A)
Figure 16B:
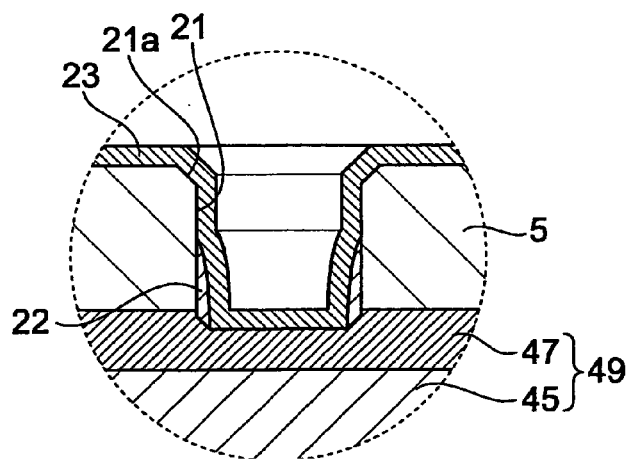

FIGS. 16A-16B give cross-sectional drawings showing another embodiment of the present invention. A cross-sectional drawing at (A) shows the formation area of the metal thin film resistor, and a cross-sectional drawing at (B) is an expanded view of the portion surrounded by a circle with a dashed line at (A). The same reference marks are given to the portions that achieve the same function as FIGS. 1A and 1B, and detailed explanation of those portions is not repeated.

The device separating oxide film 3 is formed on the silicon substrate 1. On an oxide film (illustration is omitted) formed on the silicon substrate 1, and on the device separating oxide film 3, a poly silicon pattern 45 and a wiring pattern 49 that consists of a high melting point metal film 47 formed on the poly silicon pattern 45 are formed. The material of the high melting point metal film 47 is such as WSi and TiSi.

The first interlayer insulating film 5 is formed on the silicon substrate 1 including the formation areas of the wiring pattern 49 and the device separating oxide film 3. The connecting holes 21 are formed in the first interlayer insulating film 5 corresponding to both ends of the metal thin film resistor and the wiring pattern 49. The sidewall 22 is formed on the inner wall of each connecting hole 21. The upper part 21*a* of each connecting hole 21 is formed in the taper form.

The CrSi thin film resistor 23 is formed on the first interlayer insulating film 5 in the area between the connecting holes 21, the inside of each connecting hole 21, and on the wiring pattern 49.

Although illustration is omitted, an interlayer insulating film, metal wiring, and a passivation film are formed on the first interlayer insulating film 5 including the formation area of the CrSi thin film resistor 23.

As shown at (B), since the sidewall 22 is formed on the inner wall of each connecting hole 21, the step coverage of the CrSi thin film resistor 23 in the connecting hole 21 is improved. Accordingly, the contact resistance between the wiring pattern 49 and the CrSi thin film resistor 23 is stabilized.

Further, since the upper part 21*a* of the connecting hole 21 is formed in the shape of the taper, when forming the CrSi thin film for forming the CrSi thin film resistor 23, formation of the overhang of the CrSi thin film deposited near the upper part 21*a* of the connecting hole 21 is reduced, and the adverse affect to deposition of the CrSi thin film to the connecting hole 21 can be reduced. In this manner, the step coverage of the CrSi thin film, and as the result thereof, the step coverage of the CrSi thin film resistor 23 can be raised.

FIGS. 17A-17D give cross-sectional drawings for explaining an example of the manufacturing process according to the embodiment described with reference to FIGS. 16A-16B. In FIGS. 17A-17D, the sidewall formed on the inner wall of the connecting hole, and the taper formed on the upper part of the connecting hole are not illustrated. The example of the manufacturing processes is described with reference to FIGS. 16A-16B and FIGS. 17A-17D.

(1) The device separating oxide film 3 is formed on the silicon substrate 1. An oxide film (illustration is omitted) such as a gate oxide film of a transistor is formed on the silicon substrate 1 surfaces where the device separating oxide film 3 is not formed. Then, a poly silicon film is formed all over the silicon substrate 1. Then, for example, simultaneously with formation of the gate electrode of the transistor, the poly silicon pattern 45 having a low resistance is formed. Then, a high melting point metal film is formed all over the silicon substrate 1 including the poly silicon pattern 45. The poly silicon pattern 45 is made silicide. The high melting point metal film 47, such as TiSi and WSi, is formed on the poly silicon pattern 45, and the wiring pattern 49 is formed (refer to FIG. 17A).

Figure 17A:
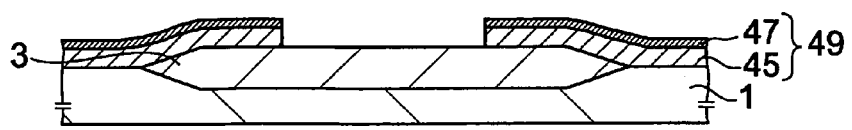
FIGS. 17A-17D give cross-sectional drawings for explaining an example of the manufacturing processes of this embodiment.
Figure 17B:
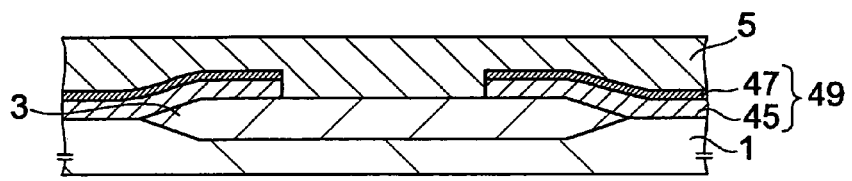
Figure 17C:
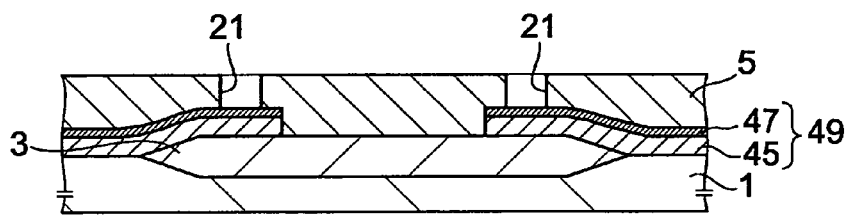
Figure 17D:
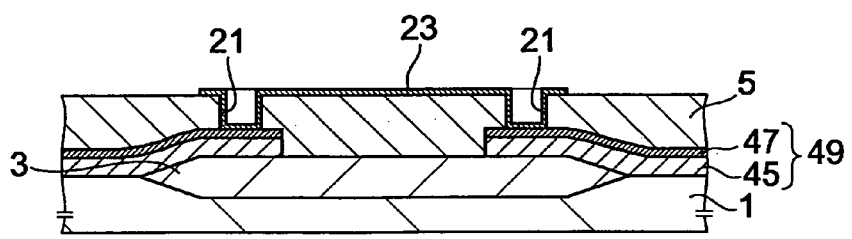

(2) The first interlayer insulating film 5 is formed all over the silicon substrate 1 including the wiring pattern 49 as in the process (1) described with reference to FIG. 2A (refer to FIG. 17B).

(3) A resist pattern (illustration is omitted) for forming the connecting hole is formed on the first interlayer insulating film 5 corresponding to both ends of the metal thin film resistor and the wiring pattern 49 by the publicly known photoengraving process. The first interlayer insulating film 5 is selectively removed using the resist pattern as a mask, and the connecting holes 21 are formed in the first interlayer insulating film 5. The high melting point metal film 47 remains at the bottom of each connecting hole 21. Then, the resist pattern is removed (refer to FIG. 17C).

(4) According to the same processes as the processes (8) and (9) described with reference to FIGS. 3b and 3C, in an Ar sputter etching chamber of, for example, multi chamber sputtering equipment, the Ar sputter etching process is performed in the vacuum to the surface of the second interlayer insulating film 19 including the inside of each connecting hole 21 such that the upper part 21a of the connecting hole 21 is shaped in the taper form, and the sidewall 22 is formed (refer to FIG. 16B). Then, immediately following the Ar sputter etching process, without breaking the vacuum state, the metal thin film for forming the metal thin film resistor is formed. Then, the metal thin film is patterned such that the CrSi thin film resistor 23 is formed (refer to FIGS. 16A-16B and FIG. 17D).

Then, although illustration is omitted, an interlayer insulating film, metal wiring, and a passivation film are formed on the first interlayer insulating film 5 including the formation area of the CrSi thin film resistor 23.

In the present example, as the manufacturing method described with reference to FIGS. 2A-2F and FIGS. 3A-3E, patterning by wet etching technology after carrying out patterning of the CrSi thin film resistor 23 is not required. Further, since the contact surface of the wiring pattern 49 and the CrSi thin film resistor 23 is not exposed to the atmosphere, a stable and satisfactory electrical connection between the CrSi thin film resistor 23 and the wiring pattern 49 is obtained. Miniaturization of the CrSi thin film resistor 23 and stabilization of the resistance are realized regardless of the thickness of the CrSi thin film resistor 23 without increasing the number of process steps.

Further, since the high melting point metal film 47 that functions as a barrier film is inserted between the CrSi thin film resistor 23 and the poly silicon pattern 45, the variation in the contact resistance between the CrSi thin film resistor 23 and the wiring pattern 49 is reduced, and precision of the resistance and improvement in the yield are attained.

Further, since the high melting point metal film 47 contributes to lowering the resistance of the poly silicon pattern 45, and is formed without increasing the number of manufacturing process steps compared with the conventional technology, the stable contact resistance between the metal thin film resistor and the wiring pattern is provided while increase of manufacture cost is suppressed.

Further, according to the manufacturing method described above, the Ar sputter etching process is performed before forming the metal thin film for forming the CrSi thin film resistor 23. For this reason, variations in the resistance due to different ground films from product to product, elapsed time from the last process, etc., can be reduced.

As for the embodiment shown in FIGS. 16A-16B, a CrSiN film can be formed on the CrSi thin film resistor 23, as in the embodiment shown in FIGS. 13A-13B.

According to the embodiments described above with reference to FIGS. 1 through 17, the sidewall 22 on the inner wall of the connecting hole 21 is formed by Ar sputter etching. However, the present invention is not limited to these embodiments. The sidewall formed on the inner wall of the connecting hole may be formed by one of an insulating material film and a conductive material film that is formed as a sidewall material on an insulating film in which the connecting hole is formed, and by carrying out an etch back process to the sidewall material.

Figure 18A:
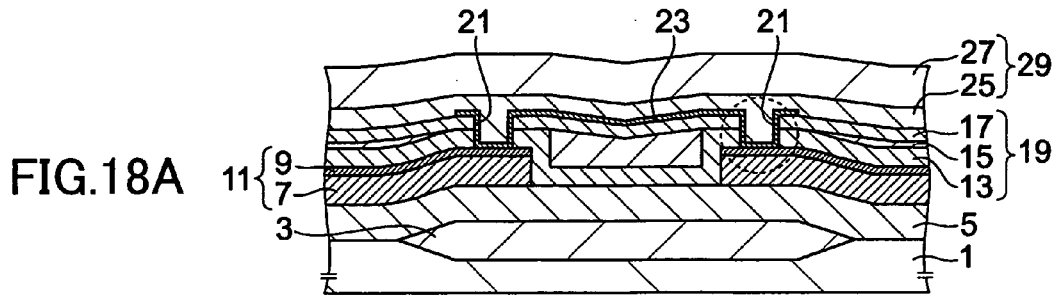
FIGS. 18A-18B give cross-sectional drawings showing the formation area of the metal thin film resistor according to another embodiment of the present invention at (A), and an expanded cross-sectional view at (B) detailing a portion surrounded by a circle with a dashed line at (A)
Figure 18B:
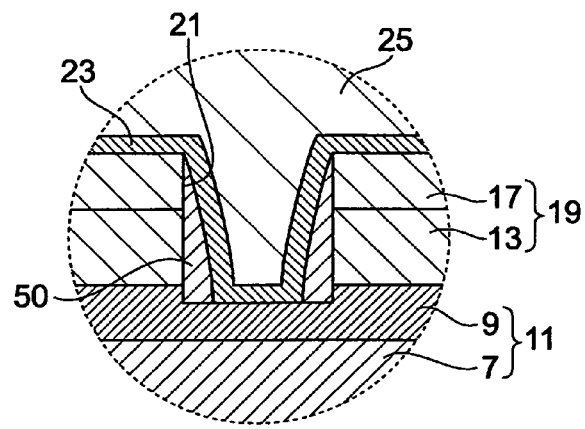

FIGS. 18A-18B give cross-sectional drawings showing another embodiment of the present invention, wherein a cross-sectional drawing at (A) shows the formation area of the metal thin film resistor, and an expanded cross-sectional drawing at (B) is an expanded view of a portion surrounded by a circle with a dashed line at (A). The same reference marks are given to the portions that achieve the same function as FIGS. 1A and 1B, and detailed explanation of those portions is not repeated.

On the silicon substrate 1, the device separating oxide film 3, the first interlayer insulating film 5, the wiring pattern 11 that consists of the metal pattern 7 and the high melting point metal film 9, the second interlayer insulating film 19 consisting of the plasma CVD oxide film 13, the SOG film 15, and the plasma CVD oxide film 17 are formed. The connecting holes 21 are formed on the second interlayer insulating film 19 corresponding to both ends of the metal thin film resistor and wiring pattern 11. A sidewall 50 (not shown at (A)) is formed by deposition of a CVD oxide film, which is then back etched, on the inner wall of each connecting hole 21. The present embodiment is different from the embodiment described with reference to FIGS. 1A and 1B in that the upper part of the connecting hole 21 is formed in the taper form not by the Ar sputter etching process.

The CrSi thin film resistor 23 is formed on the second interlayer insulating film 19 in the area between the connecting holes 21, the inside of each connecting hole 21, and the wiring pattern 11. The both ends of the CrSi thin film resistor 23 are electrically connected to the wiring pattern 11 in the respective connecting holes 21. On the insulating film 19, the passivation film 29 having the silicon oxide film 25 on the lower layer side and the silicon nitride film 27 on the upper layer side is formed on the second interlayer insulation film including the formation area of the CrSi thin film resistor 23.

As shown at (B), since the sidewall 50 is formed on the inner wall of each connecting hole 21, the step coverage of the CrSi thin film resistor 23 in the connecting hole 21 is improved. In this manner, the contact resistance between the wiring pattern 11 and the CrSi thin film resistor 23 is stabilized.

Further, since the upper part of each connecting hole 21 is formed in the shape of the taper by the shape of the sidewall 50, the undesirable influence affecting the deposition of the CrSi thin film in the connecting hole 21 is reduced, the overhang of the CrSi thin film deposited near the upper part 21a of the connecting hole 21 being prevented from forming when forming the CrSi thin film for forming the CrSi thin film resistor 23. In this manner, the step coverage of the CrSi thin film, and as the result thereof, the step coverage of the CrSi thin film resistor 23 is raised.

The manufacturing method of making the present embodiment is briefly described. The first interlayer insulating film 5, the wiring pattern 11, the second interlayer insulating film 19, and the connecting holes 21 in the second interlayer insulating film 19 are formed according to the processes same as the processes (1) through (7) described with reference to FIGS. 2A-2F and FIG. 3A.

Then, a CVD oxide film in 1000 Å thickness is formed all over the second interlayer insulating film 19 including the formation area of the connecting holes 21, an etch back process is performed to the CVD oxide film, and the sidewall 50 made from the CVD oxide film is formed on the inner wall of each connecting hole 21.

The CrSi thin film 37 is formed on the second interlayer insulating film 19 including the connecting holes 21, on the inner wall of which the sidewall 50 is formed under the same conditions as forming the CrSi thin film resistor 23 at the process (8) described with reference to FIG. 3B. Then, by processes that are the same as the processes (9) through (11) described with reference to FIGS. 3C-3E, the CrSi thin film and the passivation film 29 are formed.

In this manner, the embodiment shown in FIGS. 18A-18B is manufactured.

Figure 19A:
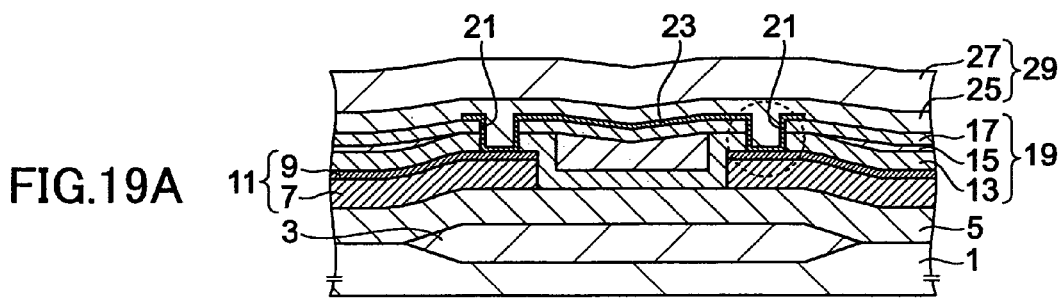
FIGS. 19A-19B give cross-sectional drawings showing the formation area of the metal thin film resistor according to another embodiment of the present invention at (A), and an expanded cross-sectional view at (B) detailing a portion surrounded by a circle with a dashed line at (A)
Figure 19B:
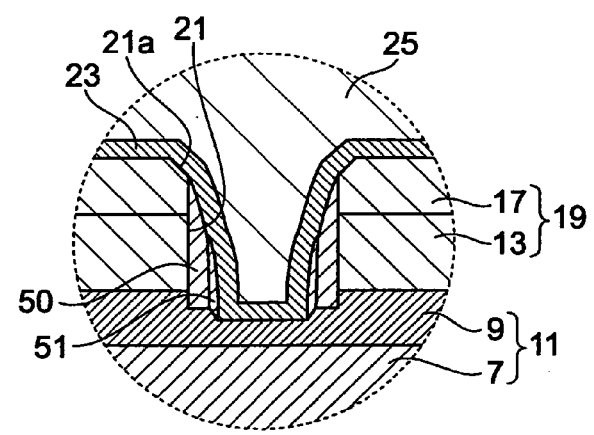

FIGS. 19A-19B give cross-sectional drawings showing further another embodiment of the present invention, wherein a cross-sectional drawing at (A) shows the formation area of the metal thin film resistor, and an expanded cross-sectional drawing at (B) is an expanded view of the portion surrounded with the dashed line at (A). The same reference marks are given to the portions that achieve the same function as FIGS. 1A and 1B and FIGS. 18A-18B, and detailed explanation of those portions is not repeated.

The present embodiment differs from the embodiment shown in FIGS. 18A-18B in that a sidewall 51 is formed on the surface of the bottom part of the sidewall 50 that is formed by deposition and etching back of a CVD oxide film on the inner wall of the connecting hole 21 as shown in FIG. 19B. Further, the present embodiment differs from the embodiment shown in FIGS. 18A-18B in that the upper part 21a of the connecting hole 21 is formed in the taper form.

The taper form of the upper part 21a and the sidewall 51 of the connecting hole 21 are formed by, for example, performing the Ar sputter etching process on the second interlayer insulating film 19 in which the connecting hole 21 and the sidewall 50 are formed. The sidewall 51 contains Ar and the materials of the high melting point metal film 9, the second interlayer insulating film 19, and the sidewall 50, namely, Ti, N, Si, and O in this example. The taper form of the upper part 21a of the connecting hole 21, and the sidewall 51 are formed by performing the Ar sputter etching process as described at the process (8) with reference to FIG. 3B after forming the sidewall 50 on the inner wall of the connecting hole 21.

Since the sidewalls 50 and 51 are formed on the inner wall of each connecting hole 21 according to the present embodiment, the step coverage of the CrSi thin film resistor 23 in the connecting hole 21 is improved. In this manner, the contact resistance between the wiring pattern 11 and the CrSi thin film resistor 23 is stabilized.

Further, since the upper part 21a of the connecting hole 21 is formed in the shape of the taper by the sidewall 50 and by the Ar sputter etching process, the undesirable influence affecting the deposition of the CrSi thin film in the connecting hole 21 when forming the CrSi thin film for forming the CrSi thin film resistor 23 is reduced. In this manner, the overhang of the CrSi thin film deposited near the upper part 21a of the connecting hole 21 is prevented from forming, and the step coverage of the CrSi thin film, as the result thereof, the step coverage of the CrSi thin film resistor 23 can be raised.

According to the present embodiment described with reference to FIGS. 18A-18B and FIGS. 19A-19B, the sidewall 50 formed on the inner wall of the connecting hole 21 is formed by the deposition and the etch back process of the CVD oxide film. However, the present invention is not limited to this, but the sidewall 50 may be made of other insulating materials, such as a nitride silicon film, and conductive materials, such as tungsten. Further, in the embodiment described with reference to FIGS. 19A-19B, if the material of the sidewall 50 is replaced, composition of the sidewall 51 formed by the Ar sputter etching process is also replaced. For example, when tungsten is used as the material of the sidewall 50, the sidewall 51 contains Ar, the materials of the high melting point metal film 9, the second interlayer insulating film 19, and the sidewall 50, namely, Ti, N, Si, O, W, and Ar.

Further, the structure of the sidewall of the embodiment described with reference to FIGS. 18A-18B and FIGS. 19A-19B is applicable to the embodiments described above with reference to FIGS. 11A-11B, FIGS. 12A-12B, FIGS. 13A-13B, and FIGS. 16A-16B.

Further, although the embodiments shown in FIGS. 1 through 19 use CrSi as the material of the metal thin film resistor, the present invention is not limited to this, but other materials can be used as the material of the metal thin film resistor, for example, NiCr, TaN and $CrSi_2$, CrSiN, CrSi, and CrSiO.

Further, according to the embodiments shown in FIGS. 1 through 19, the sidewall of the connecting hole 21 is formed in approximately perpendicular directions. However, the present invention is not limited to this. Further, the taper form does not have to be formed at only the upper part of the connecting hole, but the whole connecting hole may be tapered by, e.g., a taper etching process under different etching conditions, and an etching process combining the wet and dry etching processes. In this manner, the step coverage of the metal thin film resistor in the connecting hole 21 is improved.

The metal thin film resistor that constitutes the semiconductor device of the present invention is applicable to a semiconductor device equipped with an analog circuit. The embodiment of such semiconductor device, i.e., equipped with the analog circuit and the metal thin film resistor of the present invention, is described.

Figure 20:
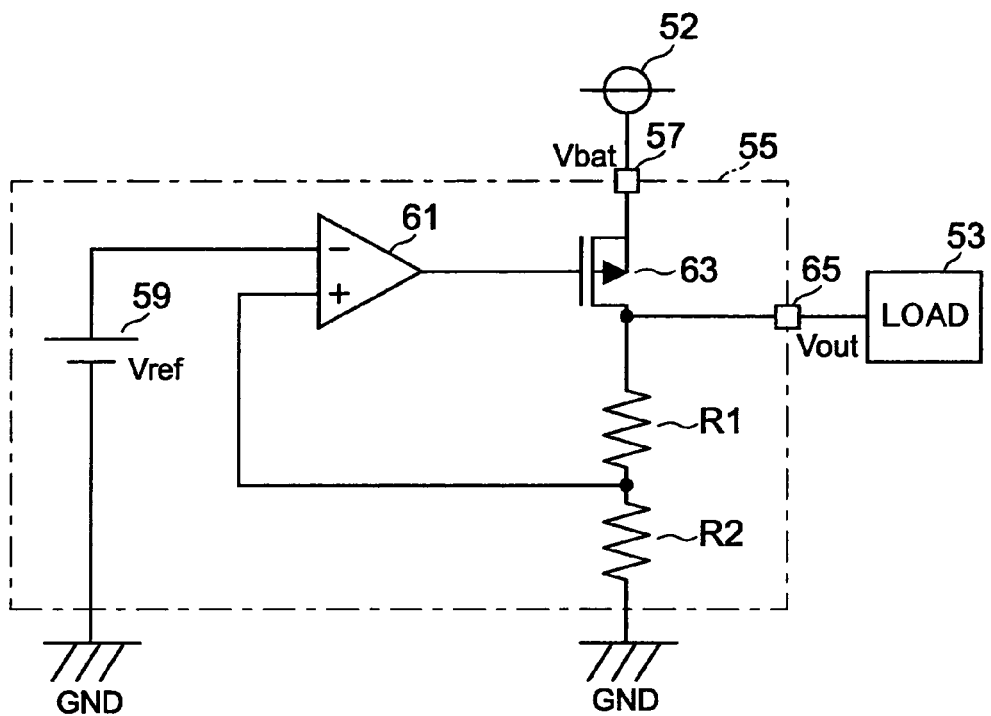
FIG. 20 is a circuit diagram showing an embodiment of the semiconductor device equipped with a constant voltage generating circuit that is an analog circuit.

FIG. 20 is a circuit diagram showing the embodiment of the semiconductor device equipped with a constant voltage generating circuit 55 that is an analog circuit.

The constant voltage generating circuit 55 receives power from a DC power supply 52, and outputs stabilized power to a load 53. The constant voltage generating circuit 55 includes an input terminal (Vbat) 57 where the DC power supply 52 is connected, a reference voltage generating circuit (Vref) 59, an operational amplifier (comparator circuit) 61, a P-channel MOS transistor (called PMOS herein below) 63 that constitutes an output driver, dividing resistors R1 and R2, and an output terminal (Vout) 65.

An output of the operational amplifier 61 of the constant voltage generating circuit 55 is provided to a gate electrode of the PMOS 63, the reference voltage generating circuit 59 provides a reference voltage Vref to a reverse input terminal (−) of the operational amplifier 61, an output voltage Vout is divided by the resistors R1 and R2, the divided voltage is provided to the non-reverse input terminal (+), and control is performed such that the divided voltage of the resistors R1 and R2 becomes equal to the reference voltage Vref.

Figure 21:
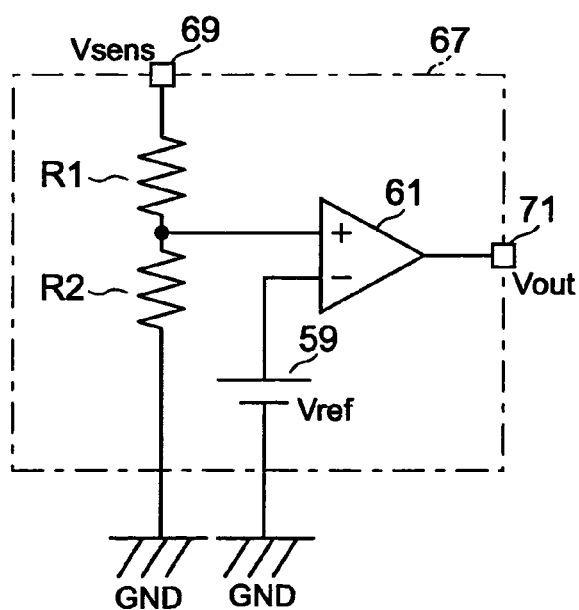
FIG. 21 is a circuit diagram showing an embodiment of the semiconductor device equipped with a voltage detecting circuit that is an analog circuit.

FIG. 21 is a circuit diagram showing another embodiment of the semiconductor device equipped an analog circuit, which is a voltage detector 67 in this example.

In the voltage detector 67, the reference voltage generating circuit 59 is connected to the reverse input terminal (−) of the operational amplifier 61, and the reference voltage Vref is provided. A voltage to be measured is input to an input terminal (Vsens) 69, and is divided by the dividing resistors R1 and R2. The divided voltage is provided to the non-reverse input terminal (+) of the operational amplifier 61. The output of the operational amplifier 61 is provided to the output terminal (Vout) 71.

The voltage detector 67 works as follows. If the voltage to be measured is high, and the divided voltage is greater than the reference voltage Vref, the operational amplifier 61 outputs an H level. Otherwise, if the voltage to be measured is low, and the divided voltage is smaller than the reference voltage Vref, the operational amplifier 61 outputs an L level.

Due to variations in manufacturing processes, the reference voltage Vref generally varies, the reference voltage Vref being provided by the reference voltage generating circuit of the constant voltage generating circuit 55 shown by FIG. 20, and the voltage detector 67 shown by FIG. 21, respectively. In order to cope with this situation, a resistor circuit (a resistive potential divider) that can adjust the resistance by disconnecting (trimming) a fuse element is used as the dividing resistor such that the resistance value of the dividing resistor can be adjusted.

Figure 22:
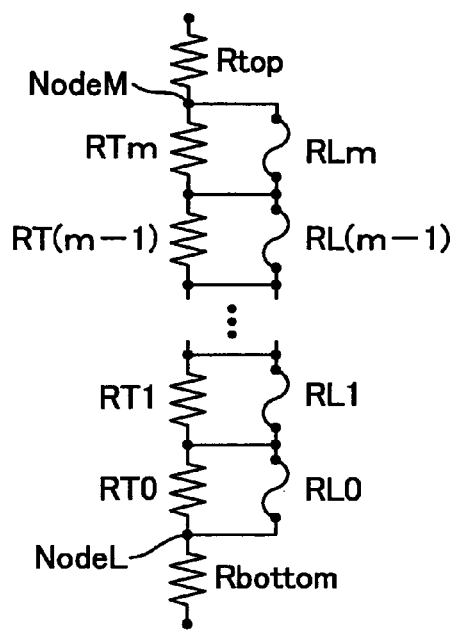
FIG. 22 is a circuit diagram showing an embodiment of the semiconductor device equipped with a resistive potential divider that is an analog circuit.
Figure 23:
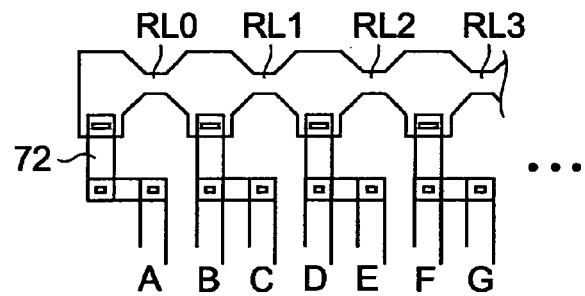
FIG. 23 is a layout drawing showing a layout example of a fuse element portion of the resistive potential divider.
Figure 24:
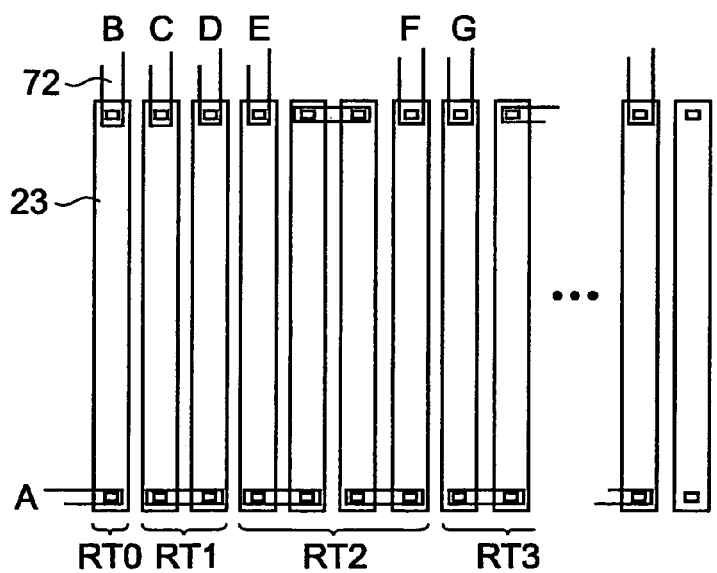
FIG. 24 is a layout drawing showing a layout example of the metal thin film resistor of the resistive potential divider.
Figure 25A:
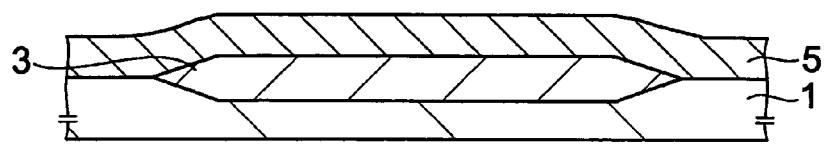
FIGS. 25A-25F are a cross-sectional drawing for explaining an example of the conventional manufacturing method.
Figure 25B:
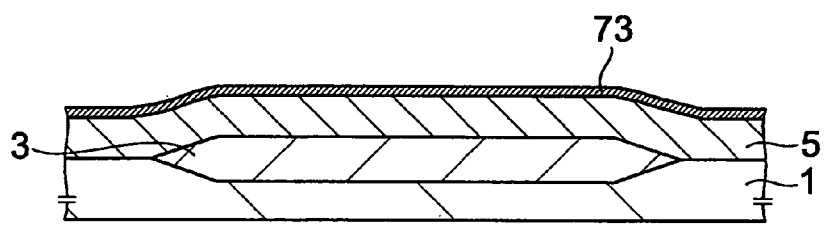
Figure 25C:
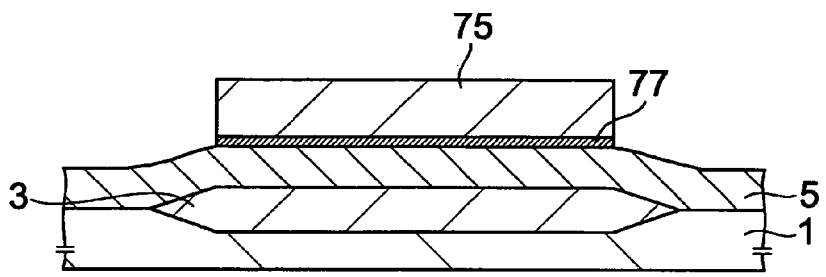
Figure 25D:
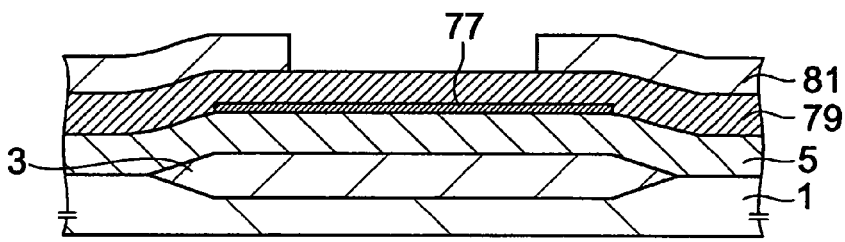
Figure 25E:
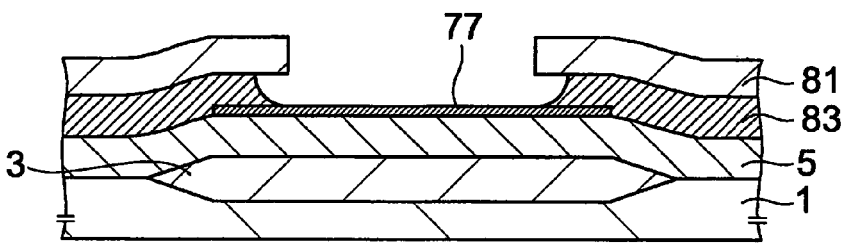
Figure 25F:
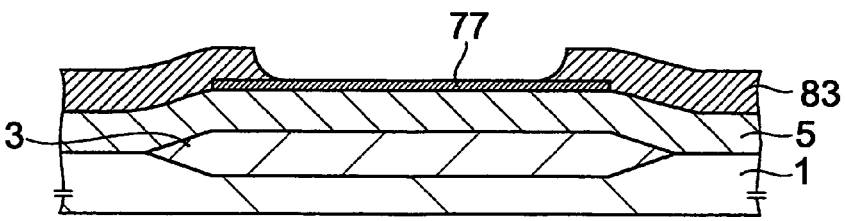
Figure 27A:
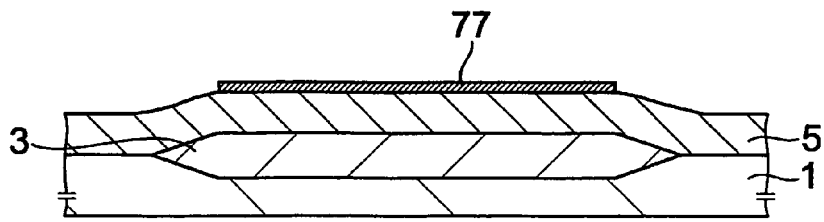
FIGS. 27A-27E are a cross-sectional drawing for explaining another example of the conventional manufacturing method.
Figure 27B:
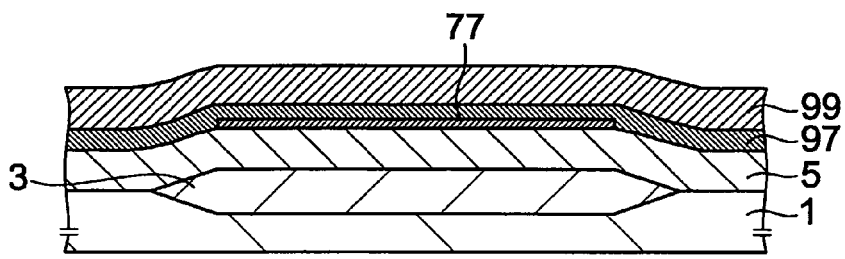
Figure 27C:
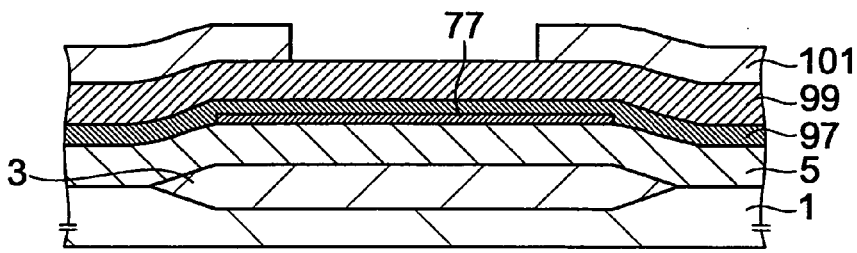
Figure 27D:
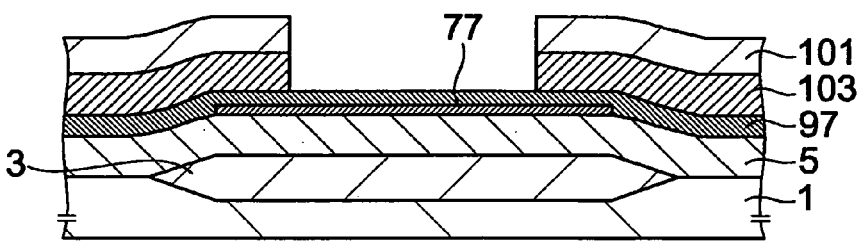
Figure 27E:
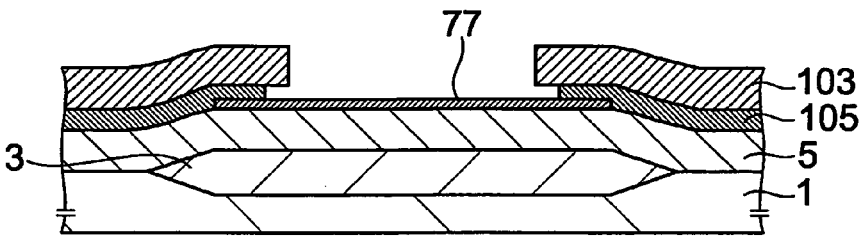
Figure 28A:
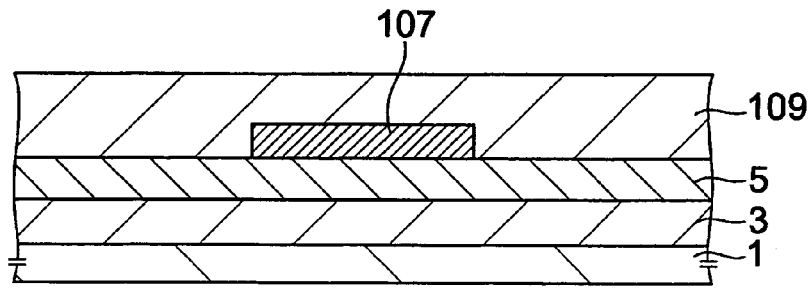
FIGS. 28A-28D are a cross-sectional drawing for explaining another example of the conventional manufacturing method.
Figure 28B:
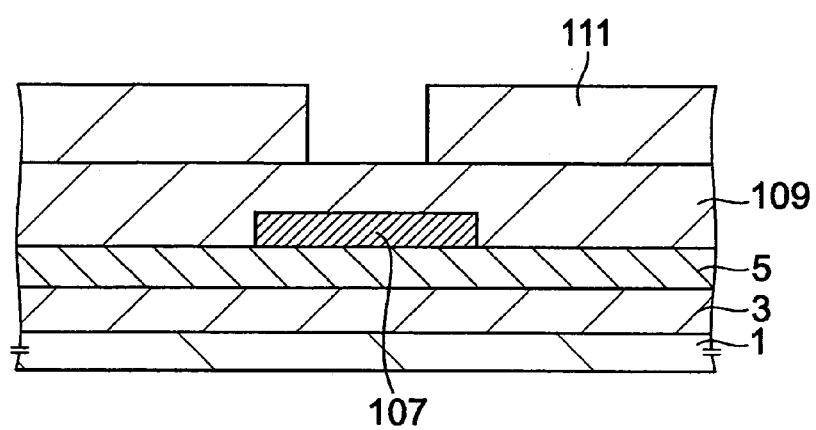
Figure 28C:
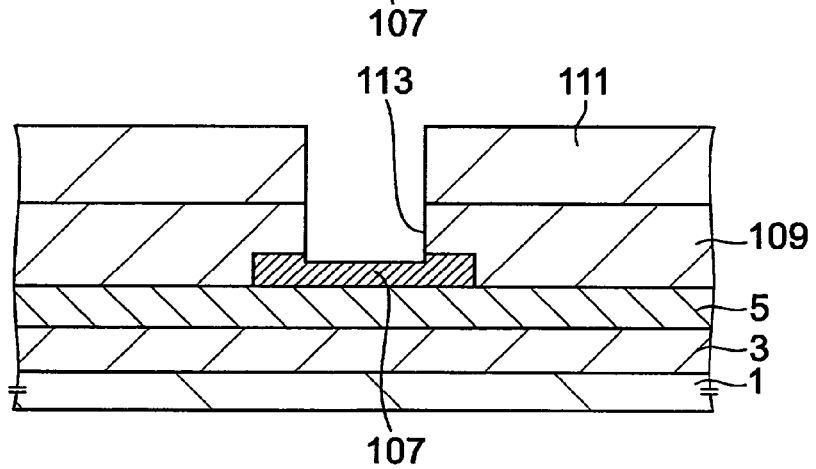
Figure 28D:
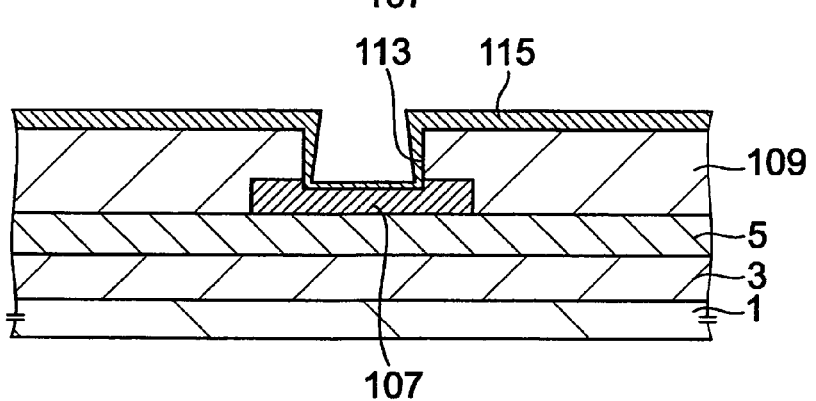

FIG. 22 is a circuit diagram showing an example of the resistive potential divider where the metal thin film resistor of the present invention is applied. FIG. 23 and FIG. 24 are layout drawings showing an example of the layout of the resistive potential divider, where FIG. 23 shows an example of the layout of a fuse element portion, and FIG. 24 shows an example of the layout of a resistor portion.

As shown in FIG. 22, the resistive potential divider includes a resistor Rbottom, m+1 resistors (m is a positive integer) RT0, RT1, through RTm, and a resistor Rtop, which are connected in series. Fuse elements RL0, RL1, through RLm are connected in parallel to the resistors RT0, RT1, through RTm, respectively.

As shown in FIG. 23, the fuse elements RL0, RL1, through RLm are formed by, for example, a poly silicon pattern, sheet resistance of which ranges from 20 to 40 Ω.

Values of the resistors RT0, RT1, through RTm are set up so that they increase exponentially from bottom to top resistors. That is, the resistance of the resistor RTn is made to be $2^n$ times the resistance of the resistor RT0.

For example, as shown in FIG. 24, one CrSi thin film resistor 23 is assigned to be the resistor RT0 as unit resistance, and $2^n$ CrSi thin film resistors 23 constitute the resistor RTn. As the resistors here, the CrSi thin film resistors 23 as described with reference to FIGS. 1A and 1B, FIGS. 11A-11B, FIGS. 12A-12B, FIGS. 13A-13B, FIGS. 16A-16B, FIGS. 18A-18B, and FIGS. 19A-19B are used.

Here, A in FIG. 23 and A in FIG. 24 are electrically connected by the metal wiring pattern 72. Similarly, between B in FIG. 23 and B in FIG. 24 are connected, and so on.

In this manner, in the resistive potential divider where the accuracy of the ratio of the resistors is considered to be important, in order to raise the accuracy, resistance/fuse pairs are connected in series in the shape of a ladder.

In such resistive potential divider as described above, a desired series resistance value is obtained by appropriately disconnecting (trimming) the fuse elements RL0, RL1, through RLm by a laser beam.

Since the resistive potential divider shown in FIG. 22 uses the metal thin film resistor of the semiconductor device of the present invention, the metal thin film resistor being miniaturized and the resistance value being stabilized, the formation area of the resistive potential divider is reduced, and improved accuracy of the output voltage is obtained.

When applying the resistive potential divider shown in FIG. 22 to the constant voltage generating circuit shown in FIG. 20, the resistor Rbottom edge is grounded, and the resistor Rtop is connected to the drain of a PMOS 71. Further, one of a terminal NodeL between the resistors RT0 and Rbottom, and a terminal NodeM between the resistors Rtop and RTm is connected to the non-reverse input terminal of the operational amplifier 61.

Since the accuracy of the output voltage of the dividing resistors R1 and R2 is raised by the resistive potential divider that employs the metal thin film resistor that constitutes the present invention, the stability of the output voltage of the constant voltage generating circuit 55 is raised. Further, the formation area of the constant voltage generating circuit 55 is reduced by the reduced size of the formation area of the resistive potential divider.

Further, when applying the dividing resistors R1 and R2 shown in FIG. 22 to the resistive potential divider of the voltage detector shown in FIG. 21, for example, the bottom end of the resistor Rbottom is grounded, and the top of the resistor Rtop is connected to an input terminal 77. Further, one of the terminal NodeL between the resistors Rbottom and RT0, and the terminal NodeM between the resistors Rtop and RTm is connected to the non-reverse input terminal of the operational amplifier 61.

Since the accuracy of the output voltage of the dividing resistors R1 and R2 can be raised by the resistive potential divider that employs the metal thin film resistor of the present invention, the accuracy of detecting the voltage by the voltage detector 67 can be raised. Further, the formation area of the voltage detector 67 is reduced by the reduction in size the formation area of the resistive potential divider.

Here, application of the semiconductor device having the metal thin film resistor according to the present invention is not limited to the resistive potential divider, but the metal thin film resistor of the present invention can be applied to any semiconductor devices equipped with a resistive potential divider.

Further, application of the semiconductor device having the metal thin film resistor according to the present invention is not limited to the semiconductor device equipped with the resistive potential divider, but the semiconductor device having the metal thin film resistor according to the present invention is applicable to any semiconductor device equipped with a metal thin film resistor. For example, the metal thin film resistor of the present invention can also be used as a resistor, resistance of which is adjusted by disconnecting (trimming) and degrading by irradiating a laser light to the resistor.

Further, the present invention is not limited to these embodiments, but variations and modifications may be made without departing from the scope of the present invention.

The present application is based on Japanese Priority Application No. 2004-042683 filed on Feb. 19, 2004 with the Japanese Patent Office, the entire contents of which are hereby incorporated by reference.

What is claimed is:

1. A semiconductor device, comprising:
a wiring pattern;
a high melting point metal film formed on an upper surface of the wiring pattern;
an insulating film formed on an upper surface of the high melting point film;
a connecting hole formed in the insulating film and in only a partial thickness of an entire thickness of the high melting point metal film;
a sidewall formed on at least a portion of an inner wall of the connecting hole; and a metal thin film resistor formed on the insulation film, on the sidewall, and on any portions of the inner wall of the connecting hole on which the sidewall is not formed, wherein the metal thin film resistor is electrically connected to the wiring pattern, wherein at least an upper part of the connecting hole is formed in a taper shape, and wherein the sidewall is formed of a different material than the insulating film.

2. The semiconductor device as claimed in claim 1, wherein the material of the sidewall contains argon.

3. The semiconductor device as claimed in claim 1, wherein a thickness of the metal thin film resistor is between 5 Å and 1000 Å.

4. The semiconductor device as claimed in claim 1, wherein a flattening process is performed to the insulating film.

5. The semiconductor device as claimed in claim 1, wherein the wiring pattern includes a metal pattern.

6. The semiconductor device as claimed in claim 1, wherein the wiring pattern comprises a poly silicon pattern.

7. The semiconductor device as claimed in claim 1, further comprising:

a metal nitride film that covers an upper surface of the metal thin film resistor, wherein a metal oxide film is not formed between the upper surface of the metal thin film resistor and the metal nitride film.

8. The semiconductor device as claimed in claim 1, wherein the wiring pattern is arranged at a layer, above which no wiring pattern is present.

9. A semiconductor device equipped with a resistive potential divider that generates an output voltage by dividing an input voltage by two or more resistors, and is capable of adjusting the output voltage by disconnecting (trimming) a fuse element, comprising:

the metal thin film resistor as claimed in claim 1.

10. A semiconductor device equipped with a voltage detecting circuit including a resistive potential divider that generates an output voltage by dividing an input voltage by two or more resistors, a reference voltage generating circuit that generates a reference voltage, and a comparator circuit that compares the output voltage of the resistive potential divider with the reference voltage of the reference voltage generating circuit, wherein the resistive potential divider is as claimed in claim 9.

11. A semiconductor device equipped with a constant voltage generating circuit that includes an output driver for controlling an output of an input voltage, a resistive potential divider for dividing output voltage and supplying the divided voltage, a reference voltage generating circuit for supplying a reference voltage, and a comparator circuit for comparing the divided voltage of the resistive potential divider with the reference voltage of the reference voltage generating circuit, and for controlling operations of the output driver according to a comparison result, wherein the resistive potential divider is as claimed in claim 9.

* * * * *